US011885838B2

(12) United States Patent
Warren et al.

(10) Patent No.: US 11,885,838 B2
(45) Date of Patent: Jan. 30, 2024

(54) MEASURING DISSIPATED ELECTRICAL POWER ON A POWER RAIL

(71) Applicant: Google LLC, Mountain View, CA (US)

(72) Inventors: Daniel Adam Warren, San Francisco, CA (US); Michael Mitchell, San Francisco, CA (US); Gwendolyn van der Linden, Mountain View, CA (US); Ford Rylander, Mountain View, CA (US); Brian Silverstein, Mountain View, CA (US); Arun Raghupathy, Pleasanton, CA (US)

(73) Assignee: Google LLC, Mountain View, CA (US)

(*) Notice: Subject to any disclaimer, the term of this patent is extended or adjusted under 35 U.S.C. 154(b) by 514 days.

(21) Appl. No.: 17/006,780

(22) Filed: Aug. 28, 2020

(65) Prior Publication Data

US 2022/0065906 A1    Mar. 3, 2022

(51) Int. Cl.
*G01R 22/06* (2006.01)
*G01R 22/10* (2006.01)
*G05D 23/19* (2006.01)

(52) U.S. Cl.
CPC ........... *G01R 22/065* (2013.01); *G01R 22/10* (2013.01); *G05D 23/1917* (2013.01)

(58) Field of Classification Search
CPC ... G01R 22/065; G01R 22/10; G05D 23/1917
USPC ....................................................... 700/276
See application file for complete search history.

(56) References Cited

U.S. PATENT DOCUMENTS

| | | | |
|---|---|---|---|
| 3,991,357 A | 11/1976 | Kaminski |
| 4,183,290 A | 1/1980 | Kucharczyk |
| 4,223,831 A | 9/1980 | Szarka |
| 4,335,847 A | 6/1982 | Levine |

(Continued)

FOREIGN PATENT DOCUMENTS

| | | | |
|---|---|---|---|
| CA | 2202008 C | 2/2000 |
| EP | 0196069 B1 | 12/1991 |

(Continued)

OTHER PUBLICATIONS

International Search Report and Written Opinion for PCT/US2021/047465 dated Jan. 14, 2022, all pages.

(Continued)

*Primary Examiner* — Mohammad Ali
*Assistant Examiner* — Saad M Kabir
(74) *Attorney, Agent, or Firm* — Kilpatrick Townsend & Stockton LLP

(57) ABSTRACT

A smart-home device may include a main power rail that provides power to components of the smart-home device; an integrator coupled to the main power rail that stores energy on an energy-storage device, where the energy stored on the energy-storage device is representative of an amount an amount of power provided to the smart-home device through the main power rail during an integration cycle of the integrator; and a counter that stores a number of integration cycles performed by the integrator during a time interval, where a total amount of power provided to the smart-home device through the main power rail during the time interval is represented by: (1) the number of integration cycles performed by the integrator during the time interval; and (2) the energy stored on the energy-storage device.

19 Claims, 16 Drawing Sheets

(56) References Cited

U.S. PATENT DOCUMENTS

| | | |
|---|---|---|
| 4,408,711 A | 10/1983 | Levine |
| 4,615,380 A | 10/1986 | Beckey |
| 4,674,027 A | 6/1987 | Beckey |
| 4,685,614 A | 8/1987 | Levine |
| 4,751,961 A | 6/1988 | Levine et al. |
| 4,897,798 A | 1/1990 | Cler |
| 4,971,136 A | 11/1990 | Mathur et al. |
| 5,088,645 A | 2/1992 | Bell |
| 5,199,637 A | 4/1993 | Adams |
| 5,211,332 A | 5/1993 | Adams |
| 5,240,178 A | 8/1993 | Dewolf et al. |
| 5,244,146 A | 9/1993 | Jefferson et al. |
| 5,395,042 A | 3/1995 | Riley et al. |
| 5,476,221 A | 12/1995 | Seymour |
| 5,499,196 A | 3/1996 | Pacheco |
| 5,555,927 A | 9/1996 | Shah |
| 5,611,484 A | 3/1997 | Uhrich |
| 5,808,294 A | 9/1998 | Neumann |
| 5,902,183 A | 5/1999 | D'Souza |
| 5,909,378 A | 6/1999 | De Milleville |
| 5,918,474 A | 7/1999 | Khanpara et al. |
| 5,977,964 A | 11/1999 | Williams et al. |
| 6,062,482 A | 5/2000 | Gauthier et al. |
| 6,066,843 A | 5/2000 | Scheremeta |
| 6,072,784 A | 6/2000 | Agrawal et al. |
| 6,095,427 A | 8/2000 | Hoium et al. |
| 6,098,893 A | 8/2000 | Berglund et al. |
| 6,213,404 B1 | 4/2001 | Dushane et al. |
| 6,216,956 B1 | 4/2001 | Ehlers et al. |
| 6,349,883 B1 | 2/2002 | Simmons et al. |
| 6,356,204 B1 | 3/2002 | Guindi et al. |
| 6,370,894 B1 | 4/2002 | Thompson et al. |
| 6,415,205 B1 | 7/2002 | Myron et al. |
| 6,478,233 B1 | 11/2002 | Shah |
| 6,645,066 B2 | 11/2003 | Gutta et al. |
| 6,769,482 B2 | 8/2004 | Wagner et al. |
| 6,990,821 B2 | 1/2006 | Singh et al. |
| 7,024,336 B2 | 4/2006 | Salsbury et al. |
| 7,149,727 B1 | 12/2006 | Nicholls et al. |
| 7,149,729 B2 | 12/2006 | Kaasten et al. |
| 7,188,482 B2 | 3/2007 | Sadegh et al. |
| 7,287,709 B2 | 10/2007 | Proffitt et al. |
| 7,379,791 B2 | 5/2008 | Tamarkin et al. |
| RE40,437 E | 7/2008 | Rosen |
| 7,469,550 B2 | 12/2008 | Chapman, Jr. et al. |
| 7,644,869 B2 | 1/2010 | Hoglund et al. |
| 7,702,424 B2 | 4/2010 | Cannon et al. |
| 7,784,704 B2 | 8/2010 | Harter |
| 7,802,618 B2 | 9/2010 | Simon et al. |
| 7,848,900 B2 | 12/2010 | Steinberg et al. |
| 7,849,698 B2 | 12/2010 | Harrod et al. |
| 7,854,389 B2 | 12/2010 | Ahmed |
| 8,010,237 B2 | 8/2011 | Cheung et al. |
| 8,019,567 B2 | 9/2011 | Steinberg et al. |
| 8,037,022 B2 | 10/2011 | Rahman et al. |
| 8,090,477 B1 | 1/2012 | Steinberg |
| 8,091,375 B2 | 1/2012 | Crawford |
| 8,131,497 B2 | 3/2012 | Steinberg et al. |
| 8,174,381 B2 | 5/2012 | Imes et al. |
| 8,180,492 B2 | 5/2012 | Steinberg |
| 8,219,249 B2 | 7/2012 | Harrod et al. |
| 8,558,179 B2 | 10/2013 | Filson et al. |
| 9,016,593 B2 | 4/2015 | Metselaar |
| 9,360,229 B2 | 6/2016 | Modi et al. |
| 10,209,688 B2 | 2/2019 | Stefanski et al. |
| 10,557,640 B2 | 2/2020 | Warren et al. |
| 2004/0249479 A1 | 12/2004 | Shorrock |
| 2005/0090915 A1 | 4/2005 | Geiwitz |
| 2005/0128067 A1 | 6/2005 | Zakrewski |
| 2005/0150968 A1 | 7/2005 | Shearer |
| 2005/0189429 A1 | 9/2005 | Breeden |
| 2005/0192915 A1 | 9/2005 | Ahmed et al. |
| 2005/0280421 A1 | 12/2005 | Yomoda et al. |
| 2006/0186214 A1 | 8/2006 | Simon et al. |
| 2006/0196953 A1 | 9/2006 | Simon et al. |
| 2007/0045431 A1 | 3/2007 | Chapman, Jr. et al. |
| 2007/0115902 A1 | 5/2007 | Shamoon et al. |
| 2007/0205297 A1 | 9/2007 | Finkam et al. |
| 2008/0015742 A1 | 1/2008 | Kulyk et al. |
| 2008/0173034 A1 | 7/2008 | Shaw et al. |
| 2008/0183335 A1 | 7/2008 | Poth et al. |
| 2008/0191045 A1 | 8/2008 | Harter |
| 2008/0273754 A1 | 11/2008 | Hick et al. |
| 2008/0317292 A1 | 12/2008 | Baker et al. |
| 2009/0171862 A1 | 7/2009 | Harrod et al. |
| 2009/0254225 A1 | 10/2009 | Boucher et al. |
| 2009/0259713 A1 | 10/2009 | Blumrich et al. |
| 2009/0297901 A1 | 12/2009 | Kilian et al. |
| 2009/0327354 A1 | 12/2009 | Resnick et al. |
| 2010/0019051 A1 | 1/2010 | Rosen |
| 2010/0025483 A1 | 2/2010 | Hoeynck et al. |
| 2010/0050004 A1 | 2/2010 | Hamilton, II et al. |
| 2010/0070084 A1 | 3/2010 | Steinberg et al. |
| 2010/0070086 A1 | 3/2010 | Harrod et al. |
| 2010/0070234 A1 | 3/2010 | Steinberg et al. |
| 2010/0084482 A1 | 4/2010 | Kennedy et al. |
| 2010/0167783 A1 | 7/2010 | Alameh et al. |
| 2010/0179704 A1 | 7/2010 | Ozog |
| 2010/0211224 A1 | 8/2010 | Keeling et al. |
| 2010/0262298 A1 | 10/2010 | Johnson et al. |
| 2010/0262299 A1 | 10/2010 | Cheung et al. |
| 2010/0280667 A1 | 11/2010 | Steinberg |
| 2010/0289643 A1 | 11/2010 | Trundle et al. |
| 2010/0308119 A1 | 12/2010 | Steinberg et al. |
| 2010/0318227 A1 | 12/2010 | Steinberg et al. |
| 2011/0046792 A1 | 2/2011 | Imes et al. |
| 2011/0046805 A1 | 2/2011 | Bedros et al. |
| 2011/0046806 A1 | 2/2011 | Nagel et al. |
| 2011/0077758 A1 | 3/2011 | Tran et al. |
| 2011/0077896 A1 | 3/2011 | Steinberg et al. |
| 2011/0151837 A1 | 6/2011 | Winbush, III |
| 2011/0160913 A1 | 6/2011 | Parker et al. |
| 2011/0185895 A1 | 8/2011 | Freen |
| 2011/0307103 A1 | 12/2011 | Cheung et al. |
| 2011/0307112 A1 | 12/2011 | Barrilleaux |
| 2012/0017611 A1 | 1/2012 | Coffel et al. |
| 2012/0065935 A1 | 3/2012 | Steinberg et al. |
| 2012/0085831 A1 | 4/2012 | Kopp |
| 2012/0101637 A1 | 4/2012 | Imes et al. |
| 2012/0158350 A1 | 6/2012 | Steinberg et al. |
| 2012/0221151 A1 | 8/2012 | Steinberg |
| 2012/0248210 A1 | 10/2012 | Warren et al. |
| 2012/0252430 A1 | 10/2012 | Imes et al. |
| 2013/0018513 A1 | 1/2013 | Metselaar |
| 2013/0099008 A1 | 4/2013 | Aljabari et al. |
| 2013/0099124 A1 | 4/2013 | Filson et al. |
| 2014/0015423 A1 | 1/2014 | Williams |
| 2014/0324232 A1 | 10/2014 | Modi et al. |
| 2014/0355650 A1 | 12/2014 | Hong et al. |
| 2016/0231755 A1 | 8/2016 | Ajax et al. |
| 2017/0299215 A1 | 10/2017 | Li et al. |
| 2019/0265281 A1* | 8/2019 | Li .................... G01R 19/02 |
| 2019/0293494 A1 | 9/2019 | Mao et al. |
| 2022/0026086 A1 | 1/2022 | Martinez et al. |

FOREIGN PATENT DOCUMENTS

| | | |
|---|---|---|
| JP | S59106311 A | 6/1984 |
| JP | H01252850 A | 10/1989 |
| WO | 2014-176176 A1 | 10/2014 |

OTHER PUBLICATIONS

Aprilaire Electronic Thermostats Model 8355 User's ManualResearch Products Corporation, Dec. 2000, 16 pages.

Braeburn 5300 Installer Guide, Braeburn Systems, LLC, Dec. 9, 2009, 10 pages.

Braeburn Model 5200, Braeburn Systems, LLC, Jul. 20, 2011, 11 pages.

Ecobee Smart Si Thermostat Installation Manual, Ecobee, Apr. 3, 2012, 40 pages.

Ecobee Smart Si Thermostat User Manual, Ecobee, Apr. 3, 2012, 44 pages.

(56) References Cited

OTHER PUBLICATIONS

Ecobee Smart Thermostat Installation Manual, Jun. 29, 2011, 20 pages.
Ecobee Smart Thermostat User Manual, May 11, 2010, 20 pages.
Electric Heat Lock Out on Heat Pumps, Washington State University Extension Energy Program, Apr. 2010, pp. 1-3.
Honeywell Installation Guide FocusPRO TH6000 Series, Honeywell International, Inc., Jan. 5, 2012, 24 pages.
Honeywell Operating Manual FocusPRO TH6000 Series, Honeywell International, Inc., Mar. 25, 2011, 80 pages.
Honeywell Prestige THX9321 and TXH9421 Product Data, Honeywell International, Inc., 68-0311, Jan. 2012, 126 pages.
Honeywell Prestige THX9321-9421 Operating Manual, Honeywell International, Inc., Jul. 6, 2011, 120 pages.
Hunter Internet Thermostat Installation Guide, Hunter Fan Co., Aug. 14, 2012, 8 pages.
Introducing the New Smart Si Thermostat, Datasheet [online], retrieved from the Internet: <URL: https://www.ecobee.com/solutions/home/smart-si/> [retrieved on Feb. 25, 2013], Ecobee, Mar. 12, 2012, 4 pages.
Lennox ComfortSense 5000 Owners Guide, Lennox Industries, Inc., Feb., 2008, 32 pages.
Lennox ComfortSense 7000 Owners Guide, Lennox Industries, Inc., May, 2009, 15 pages.
Lennox iComfort Manual, Lennox Industries, Inc., Dec., 2010, 20 pages.
Lux PSPU732T Manual, LUX Products Corporation, Jan. 6, 2009, 48 pages.
NetX RP32-WiFi Network Thermostat Consumer Brochure, Network Thermostat, May, 2011, 2 pages.
NetX RP32-WiFi Network Thermostat Specification Sheet, Network Thermostat, Feb. 28, 2012, 2 pages.
RobertShaw Product Manual 9620, Maple Chase Company, Jun. 12, 2001, 14 pages.
RobertShaw Product Manual 9825i2, Maple Chase Company, Jul. 17, 2006, 36 pages.
SYSTXCCUIZ01-V Infinity Control Installation Instructions, Carrier Corp, May 31, 2012, 20 pages.
T8611G Chronotherm IV Deluxe Programmable Heat Pump Thermostat Product Data, Honeywell International Inc., Oct., 1997, 24 pages.
TB-PAC, TB-PHP, Base Series Programmable Thermostats, Carrier Corp, May 14, 2012, 8 pages.
The Perfect Climate Comfort Center PC8900A W8900A-C Product Data Sheet, Honeywell International Inc., Apr. 2001, 44 pages.
TP-PAC, TP-PHP, TP-NAC, TP-NHP Performance Series AC/HP Thermostat Installation Instructions, Carrier Corp, Sep., 2007, 56 pages.
Trane Communicating Thermostats for Fan Coil, Trane, May, 2011, 32 pages.
Trane Communicating Thermostats for Heat Pump Control, Trane, May, 2011, 32 pages.
Trane Install XL600 Installation Manual, Trane, Mar., 2006, 16 pages.
Trane XL950 Installation Guide, Trane, Mar., 2011, 20 pages.
Venstar T2900 Manual, Venstar, Inc., Apr., 2008, 113 pages.
Venstar T5800 Manual, Venstar, Inc., Sep. 7, 2011, 63 pages.
VisionPRO TH8000 Series Installation Guide, Honeywell International, Inc., Jan. 2012, 12 pages.
VisionPRO TH8000 Series Operating Manual, Honeywell International, Inc., Mar. 2011, 96 pages.
VisionPRO Wi-Fi Programmable Thermostat User Guide, Honeywell International, Inc., Aug. 2012, 48 pages.
White Rodgers (Emerson) Model 1F81-261 Installation and Operating Instructions, White Rodgers, Apr. 15, 2010, 8 pages.
White Rodgers (Emerson) Model IF98EZ-1621 Homeowner's User Guide, White Rodgers, Jan. 25, 2012, 28 pages.
Akhlaghinia et al., Occupancy Monitoring in Intelligent Environment through Integrated Wireless Localizing Agents, IEEE, 2009, 7 pages.
Akhlaghinia et al., Occupant Behaviour Prediction in Ambient Intelligence Computing Environment, Journal of Uncertain Systems, vol. 2, No. 2, 2008, pp. 85-100.
Allen et al., Real-Time Earthquake Detection and Hazard Assessment by ElarmS Across California, Geophysical Research Letters, vol. 36, L00B08, 2009, pp. 1-6.
Chatzigiannakis et al., Priority Based Adaptive Coordination of Wireless Sensors and Actors, Q2SWinet '06, Oct. 2006, pp. 37-44.
Deleeuw, Ecobee WiFi Enabled Smart Thermostat Part 2: The Features Review, retrieved from <URL: http://www.homenetworkenabled.com/content.php?136-ecobee-WiFi-enabled-Smart-Thermostat-Part-2-The-Features-review> [retrieved on Jan. 8, 2013], Dec. 2, 2011, 5 pages.
Gao et al., The Self-Programming Thermostat: Optimizing Setback Schedules Based on Home Occupancy Patterns, in Proceedings of the First ACM Workshop on Embedded Sensing Systems for Energy-Efficiency in Buildings, Nov. 3, 2009, 6 pages.
Loisos et al., Buildings End-Use Energy Efficiency: Alternatives to Compressor Cooling, California Energy Commission, Public Interest Energy Research, Jan. 2000, 80 pages.
Lu et al., The Smart Thermostat: Using Occupancy Sensors to Save Energy in Homes, in Proceedings of the 8th ACM Conference on Embedded Networked Sensor Systems, Nov. 3-5, 2010, pp. 211-224.
Mozer, The Neural Network House: An Environmental that Adapts to its Inhabitants, Proceedings of the American Association for Artificial Intelligence SS-98-02, 1998, pp. 110-114.
Ros et al., Multi-Sensor Human Tracking with the Bayesian Occupancy Filter, IEEE, 2009, 8 pages.
Wong et al., Maximum Likelihood Estimation of ARMA Model with Error Processes for Replicated Observations, National University of Singapore, Department of Economics, Working Paper No. 0217, Feb. 2002, pp. 1-19.
International Search Report and Written Opinion dated Aug. 28, 2014 in International Patent Application No. PCT/US2014/034836, 15 pages.
International Preliminary Report on Patentability dated Oct. 27, 2015 in International Patent Application No. PCT/US2014/034836 11 pages.

* cited by examiner

MEASURING DISSIPATED ELECTRICAL POWER ON A POWER RAIL

TECHNICAL FIELD

This patent specification relates to systems, methods, and related computer program products for the monitoring and control of energy-consuming systems or other resource-consuming systems. More particularly, this patent specification relates to estimating an external ambient temperature.

BACKGROUND

Digital electronic thermostats have been used for years to regulate temperatures within enclosures, such as homes, office buildings, warehouses, and so forth. Thermostats generally operate by sensing and ambient temperature within at least a portion of a structure. The thermostat then operates an HVAC system such that the ambient temperature can be conditioned to approach a setpoint temperature that is either set by the user or retrieved from a programmed control schedule. Accurately conditioning the temperature within an enclosure may rely in large part upon the accuracy of the thermostat in estimating the ambient temperature in the surrounding enclosure. To accurately estimate the indoor temperature, thermostats rely at least in part on one or more internal temperature sensors. These temperature sensors are placed within the housing of the thermostat and used to sense the temperature of the area immediately surrounding the thermostat.

Digital electronic thermostats typically employ integrated circuits that control the flow of electric power to a Heating, Ventilation, and Air Conditioning (HVAC) system. Electronic circuits may include switching elements, rectifiers, and/or microprocessors. More modern thermostats also include advanced features, such as active user interfaces, wireless communications, local wireless network generation, high-power processors for computing complex time estimates and temperature-control algorithms, and/or other electronic components. Each of these electronic components may generate heat as a byproduct of their normal operation. As heat is generated by these components within the thermostat housing, excessive internal heat may build up as each of these components operates. This generation of internal heat, or "self-heating" of the thermostat may interfere with the accurate measurement of the ambient temperature by the internal temperature sensors. This problem is compounded when the electronic components of the thermostat are switched on and off at irregular intervals in order to save power, and the internal heating becomes unpredictable using conventional techniques. The inaccuracies caused by this internal heating not only affect the temperature sensors, but in turn also affect the ability of the thermostat to condition the surrounding environment efficiently, which may cause the thermostat to no longer meet its intended purpose.

BRIEF SUMMARY

In some embodiments, a smart-home device may include a main power rail that provides power to one or more components of the smart-home device. The smart-home device may also include an integrator coupled to the main power rail that stores energy on an energy-storage device, wherein the energy stored on the energy-storage device is representative of an amount an amount of power provided to the smart-home device through the main power rail during an integration cycle of the integrator. The smart-home device may also include a counter that stores a number of integration cycles performed by the integrator during a time interval. A total amount of power provided to the smart-home device through the main power rail during the time interval may be represented by the number of integration cycles performed by the integrator during the time interval; and the energy stored on the energy-storage device.

In some embodiments, a method of measuring an amount of power provided to a smart-home device through a main power rail may include providing power to one or more components of the smart-home device through a main power rail. The method may also include storing energy on an energy-storage device using an integrator that is coupled to the main power rail. The energy stored on the energy-storage device may be representative of an amount an amount of power provided to the smart-home device through the main power rail during an integration cycle of the integrator. The method may further include counting a number of integration cycles performed by the integrator during a time interval. A total amount of power provided to the smart-home device through the main power rail during the time interval may be represented by the number of integration cycles performed by the integrator during the time interval; and the energy stored on the energy-storage device.

In some embodiments, a power-measurement circuit may include an integrator coupled to a main power rail. The integrator may store energy on an energy-storage device, and the energy stored on the energy-storage device may be representative of an amount an amount of power provided through the main power rail during an integration cycle of the integrator. The power-measurement circuit may also include a counter that stores a number of integration cycles performed by the integrator during a time interval. A total amount of power provided through the main power rail during the time interval may be represented by the number of integration cycles performed by the integrator during the time interval and the energy stored on the energy-storage device.

In any embodiment, one or more of the following features may be implemented in any combination and without limitation. The integrator may include an operational amplifier configured to operate as an integrator, and the energy-storage device may include a capacitor coupled to an output of the operational amplifier. The device may also include a transistor between the energy-storage device and a ground, where a reset signal may cause the transistor to drain the energy stored on the energy-storage device to the ground. The device may also include a resistor on the main power rail and a differential amplifier that may generate an output based on an instantaneous voltage drop across the resistor on the main power rail, where the output of the differential amplifier is sent to the integrator. The output of the differential amplifier may be sent through a low-pass filter before being sent to the integrator. The device may also include a comparator that compares an electrical measurement of the energy-storage device to a threshold. The device may also include an analog-to-digital converter that may convert an electrical measurement of the energy-storage device. The counter may be part of a microprocessor integrated circuit, and the integrator may be a board-level component. The integration cycle of the integrator may begin when a reset signal causes the energy stored on the energy-storage device to be removed from the energy-storage device, and the integration cycle of the integrator may end when an electrical measurement of the energy-storage device exceeds a threshold. The method/operations may also include calculating the total amount of power provided to the smart-home device through the main power rail during the time interval at least in part by multiplying the number of integration cycles performed by the integrator during the time interval by an amount of power provided to the smart-home device through the main power rail during a single integration cycle. The method/operations may also include calculating the total amount of power provided to the smart-home device through the main power rail during the time interval at least in part by converting the amount of energy stored on the energy-storage device into a digital representation, and determining an amount of power used during a current integration cycle based on the digital representation. The smart-home device may include a thermostat. The smart-home device may include a digital home assistant. The method/operations may also include providing the total amount of power provided to the smart-home device through the main power rail during the time interval to a thermal model for estimating an ambient temperature around the smart-home device.

DETAILED DESCRIPTION

A smart thermostat refers to a thermostat that can communicate via a network and allows a user to interact with the smart thermostat from a remote location, such as via a mobile device (e.g., smartphone, tablet computer, desktop computer, laptop computer, etc.). Additionally or alternatively, a smart thermostat has advanced features such as sensing as to whether any persons are in the vicinity of the smart thermostat and adjusting a setpoint temperature of the thermostat based on the sensed occupancy.

When a smart thermostat is installed, such as in a user's home, the user may desire that the smart thermostat be relatively easy to interact with and is also aesthetically pleasing. Embodiments detailed herein are directed to smart thermostats that can include a touch strip that is used by the user to provide input directly to the smart thermostat. In some embodiments, the touch strip is the only user interface present on the smart thermostat. Additionally, the user can interact with the thermostat via an application executed on a mobile device.

The smart thermostat may have a mirrored cover on a face of the thermostat. When the electronic display is turned off, the mirrored cover may have the visual effect of appearing to be a mirror to a user viewing the face of the thermostat. When the electronic display is illuminated, the mirrored cover has a sufficient transmissivity to allow the illuminated portion of the electronic display to be viewed by the user through the cover. In some embodiments, the cover does not have any cutouts, holes, lenses, or variations on the front surface that could be visible to the user.

The smart thermostat may have a radar sensor. The radar sensor may sense the ambient environment of the smart thermostat through the cover. The cover may use one or more ceramic oxide layers to achieve reflectivity rather than using any metallic layers. In some embodiments, no metallic layer is present within the cover. The lack of a metallic layer can help increase the transmissivity for electromagnetic radiation (or radio waves) emitted by the radar sensor and received by the radar sensor through the cover.

Figure 1:
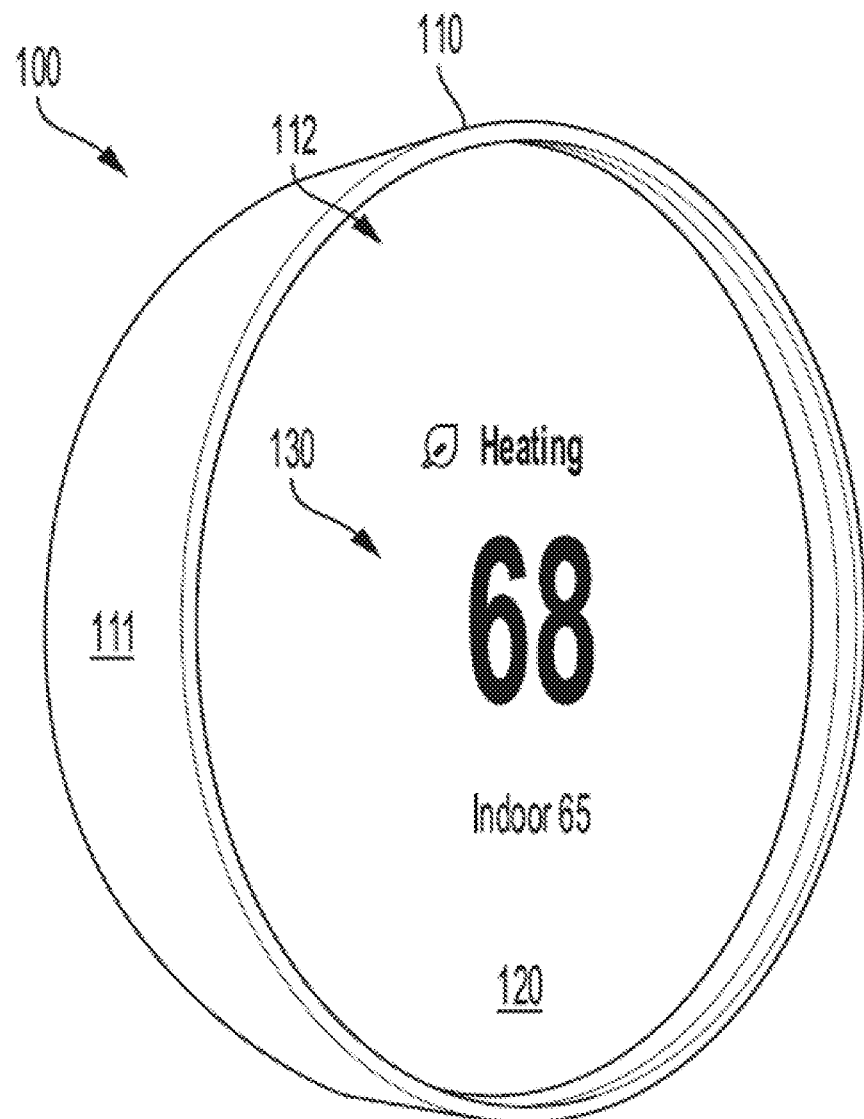
FIG. 1 illustrates a smart thermostat with an electronic display presenting information, according to some embodiments.

Further detail regarding the smart thermostat is provided in relation to the figures. FIG. 1 illustrates a smart thermostat 100 with an electronic display presenting information, according to some embodiments. As visible in FIG. 1, housing 110, cover 120, and a portion of an illuminated electronic display 130 ("display 130") can be seen.

Housing 110 defines rounded aperture 112, such as a circular aperture, in which cover 120 may be attached with housing 110. Housing 110 includes sidewall 111. In the illustrated embodiment, sidewall 111 is generally cylindrical. Around an axis perpendicular to cover 120, a radius of sidewall 111 may be greater at front of housing 110 where cover 120 is housed and smaller toward a back of housing 110.

Cover 120 is housed by housing 110 such that within aperture 112 cover 120 is visible when the front of smart thermostat 100 is viewed. Cover 120 can have a reflectivity such that when display 130 is not illuminated, cover 120 appears to be a mirror when viewed by a user.

Display 130 is housed behind cover 120 such that, when illuminated, the portion of display 130 that is illuminated is visible through cover 120 by a user. In some embodiments, due to the reflectivity of cover 120, an edge of display 130 is not visible to a user regardless of whether display 130 is illuminated, partially illuminated, or not illuminated. Therefore, the overall effect experienced by a user may be that cover 120 appears as a mirror and portions of display 130, when illuminated, are visible through cover 120.

In some embodiments, display 130 is not a touch screen. Therefore, in such embodiments, a user is required to use another user interface to interact with smart thermostat 100. The user may use an application executed by a mobile device to interact with the thermostat via a wireless network or a direct wireless connection (e.g., Bluetooth). A user interface, such as a capacitive touch strip, may be present on smart thermostat 100. In some embodiments, the capacitive touch strip is the only user interface present on smart thermostat through which a user can interact with presented menus, icons, and other data presented on display 130. Further, in some embodiments, no user interface present on smart thermostat 100 has any moving parts. When smart thermostat 100 is fully installed, no components may be accessible or visible to the user that are movable.

Figure 2:
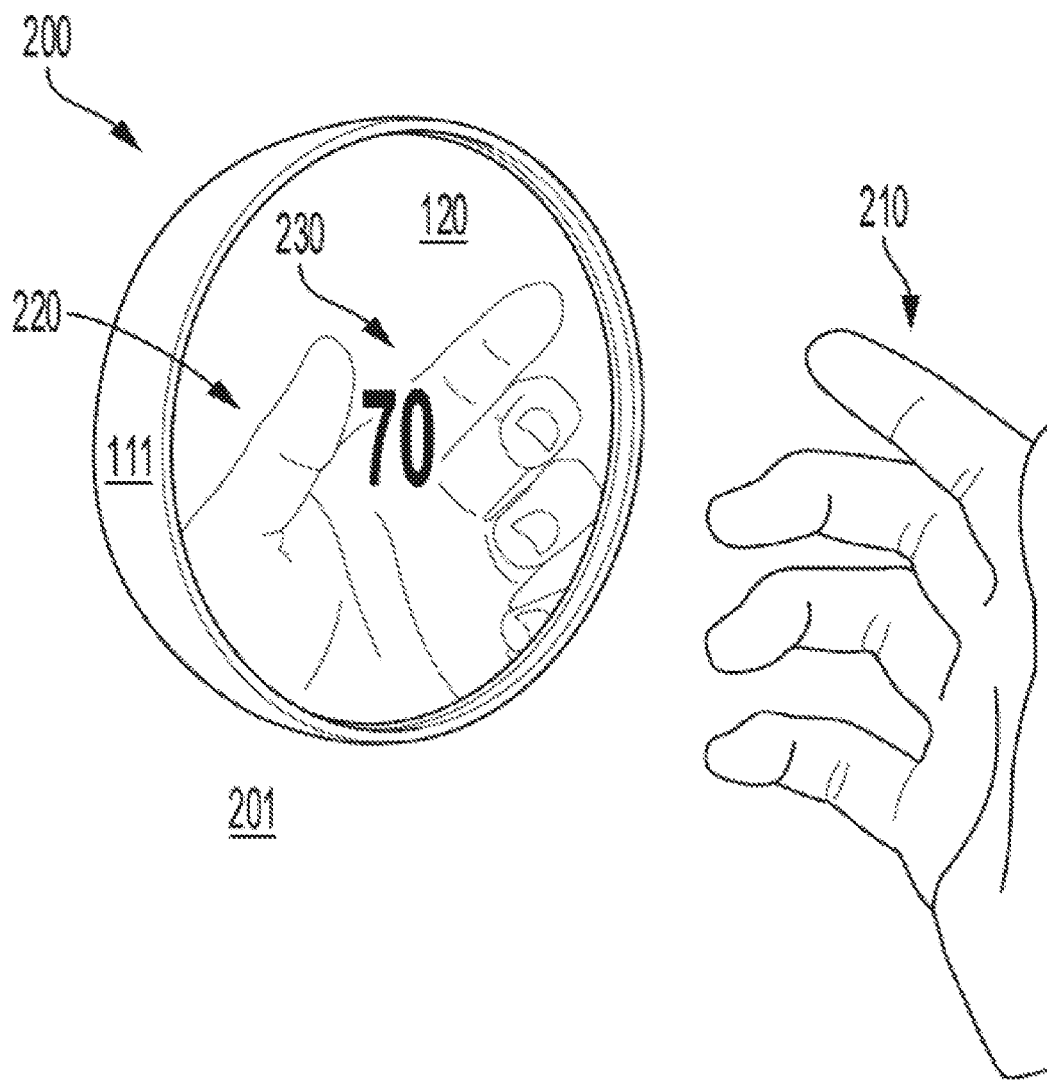
FIG. 2 illustrates a user's hand being present near thermostat that is mounted to a wall, according to some embodiments.

FIG. 2 illustrates a view 200 of a user's hand being present near thermostat 100 that is mounted to wall 201, according to some embodiments. In embodiment 200, cover 120 is sufficiently reflective that a reflection 220 of user's hand 210 is visible. Cover 120 has a sufficient transmissivity that temperature 230, as presented by display 130 through cover 120, is also visible. To calculate transmittance, a perception weighted average can be used. In some embodiments, such as those in which cover 120 appears to have a "silver" tint, transmissivity may be 29%. For other colors, such as when cover 120 has a "rose" or "nickel" tint, transmissivity may be 22% and 18.6% respectively. In other embodiments, transmissivity may be between 15% and 55%. Reflectivity may be between 75% and 40% depending on embodiment.

As can be seen in embodiment 200, except for portions of display 130 that are illuminated, cover 120 appears as an uninterrupted surface with no gaps, holes, lens, or other discontinuities present on cover 120.

Figure 3A:
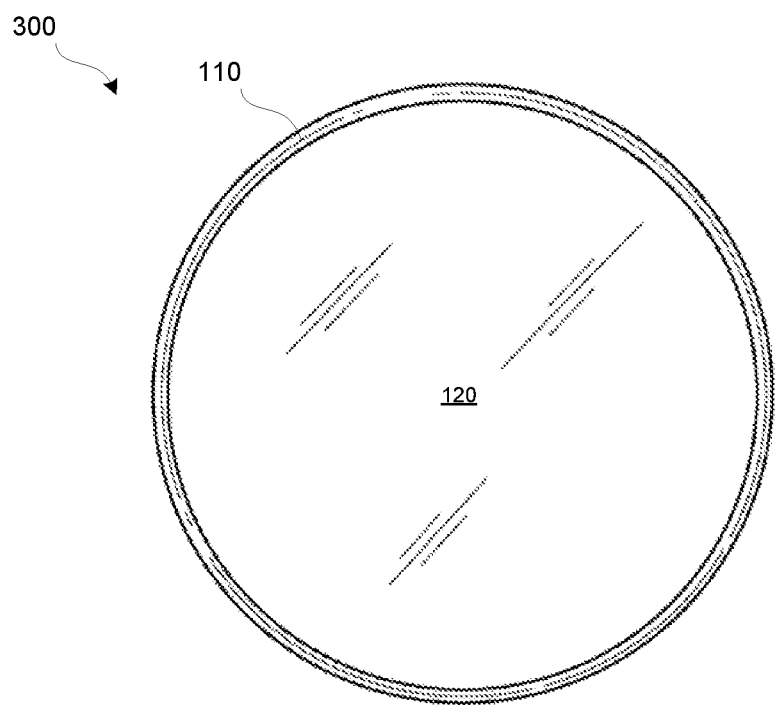
FIG. 3A-3B illustrates a smart thermostat as viewed from the front and the right, according to some embodiments.

FIG. 3A illustrates a smart thermostat 300 as viewed from the front, according to some embodiments. When mounted on a wall or other surface, cover 120 is opposite the portion of thermostat 300 that mounts to the wall or other surface. Therefore, when a user is facing mounted thermostat 300, cover 120 is visible.

Smart thermostat 300 can represent an embodiment of thermostat 100 of FIGS. 1 and 2. Housing 110 can define a rounded aperture in which cover 120 is located. In some embodiments, housing 110 defines a circular aperture in which cover 120 is located. In such embodiments, cover 120 can be circular. As previously detailed, cover 120 can form an uninterrupted surface with no gaps, holes, lens, or other discontinuities present on cover 120. Cover 120 has sufficient transmissivity to allow light emitted by electronic display 130 located within housing 110 to be visible through cover 120. Cover 120 can have sufficient reflectivity such that a mirrored effect is present on portions of cover 120 that are not currently being illuminated from behind by electronic display 130. Notably, in some embodiments, it is not possible for a user to view where an edge of electronic display 130 is through cover 120 due to the reflectivity of cover 120.

Figure 3B:
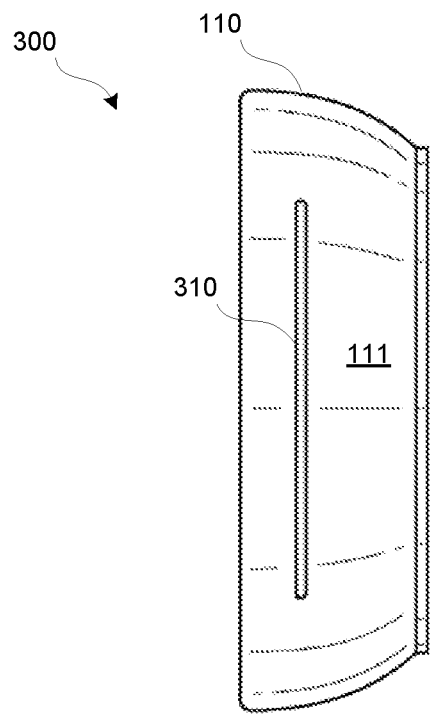

FIG. 3B illustrates a smart thermostat 300 as viewed from the right, according to some embodiments. Thermostat 300 can represent thermostat 100 of FIG. 1. When thermostat 300 is mounted to a wall or other surface, touch strip indicator 310 may be visible on the right side of sidewall 111. Touch strip indicator 310 may be a visible indicator, such as a line, shading, or some form of shape or marking that serves as a visible indicator as to where a user can touch sidewall 111 to provide user input. Within housing 110, on an inner side of the sidewall opposite touch strip indicator 310, can be a touch strip that can detect one or more types of gestures performed by a user on or near touch strip indicator 310. For example, a user can perform a tap gesture (touch and release), a swipe gesture (e.g., swipe upward along touch strip indicator 310, swipe downward along touch strip indicator 310), or a long hold gesture (touch and hold for at least a threshold amount of time).

The touch strip may be capacitive and, through sidewall 111 of housing 110, a user's touch against sidewall 111 can be detected. Touch strip indicator 310 may serve to indicate to a user the region in which the user's touch is sensed. Any gesture performed significantly away from touch strip indicator 310 may be unlikely to be sensed by the touch strip. The touch strip located within housing 110 may represent the only user input component present on thermostat 300 through which a user can directly provide input to thermostat 300. Additionally, a user may use an application or website executed on another computerized device to interact with thermostat 300.

The tactile sensation when a user moves his finger over touch strip indicator 310 might be no different than sidewall 111. Alternatively, touch strip indicator 310 may have a variance in protrusion or texture from sidewall 111 so that a user can determine the location of touch strip indicator 310 by touch. For instance, a multi-layer (e.g., 4 layer) pad print may be performed to create touch strip indicator 310 such that a subtle protrusion of touch strip indicator 310 is present. Such an arrangement may be beneficial when interacting with thermostat 300 in a darkened environment.

In the embodiment of thermostat 300, touch strip indicator 310 and the corresponding touch strip are located on a right side of thermostat 300 when viewed from the front (such as seen in FIG. 3). In other embodiments, the touch strip and corresponding touch strip indicator 310 may be present on a top, bottom, or left of sidewall 111. In some embodiments, multiple touch strips may be present, such as on the left and right of sidewall 111.

Figure 4:
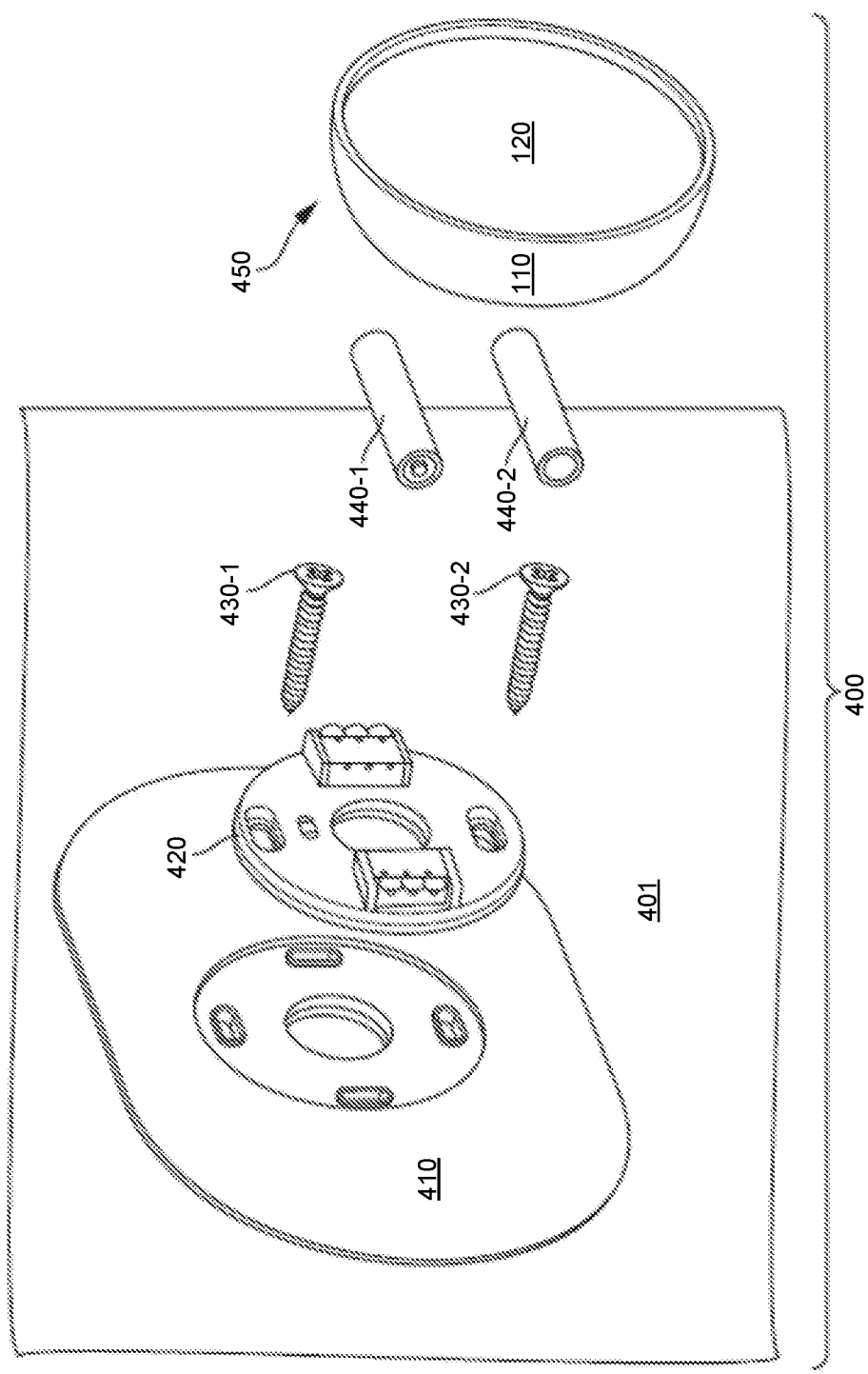
FIG. 4 illustrates a thermostat mounting system, according to some embodiments.

FIG. 4 illustrates a thermostat mounting system 400, according to some embodiments. Thermostat mounting system 400 can include: trim plate 410; backplate 420; fasteners 430; batteries 440; and thermostat 450. Thermostat 450 can represent an embodiment of thermostat 100 of FIG. 1 and the other thermostat embodiments detailed herein. Trim plate 410 may be plastic, wooden, or metallic plate that defines several holes to accommodate fasteners 430 and allow HVAC (heating, ventilation, and air conditioning) control wires to pass through. Trim plate 410 may serve to conceal any unsightly holes present in wall 401, such as where previous drilling occurred, electrical boxes, paint mismatches, or other aesthetic variances.

Backplate 420 may include multiple receptacles, with each receptacle designated to receive a particular HVAC control wire. Backplate 420 can define one or more holes configured to receive fasteners 430. Fasteners 430 can secure backplate 420 and, if being used, trim plate 410, to a surface, such as a wall.

In some embodiments, two fasteners, fastener 430-1 and fastener 430-2 may be presented. Fasteners 430 may be screws, nails, or some other form of fastener. Fasteners 430 can securely hold backplate 420 and, possibly, trim plate 410 to a surface, such as a wall. Thermostat 450 may removably attach with backplate 420. A user may be able to attach thermostat 450 to backplate 420 by pushing thermostat 450 against backplate 420. Similarly, a user can remove thermostat 450 from backplate 420 by pulling thermostat 450 away from backplate 420. When thermostat 450 is connected with backplate 420, electrical connections between thermostat 450 and HVAC control wires that have been connected with the receptacles of backplate 420.

In some embodiments, HVAC control wires can include a "C" wire, which stands for common wire. The C wire delivers power, such as in the form of 24 V AC, to thermostat 450. Thermostat 450, being connected with a C wire (and, possibly an "R" wire, which is typically red), can have access to a power supply that does not need to be periodically replaced or recharged, such as batteries 440. In some embodiments, if a C wire is not present, thermostat 450 can function using batteries 440 as its exclusive power source.

Batteries 440, which can include one or more batteries, such as battery 440-1 and battery 440-2, can serve as a primary power source or as a backup power source. In some embodiments, one or more features of thermostat 450 can be disabled if only batteries 440 are available as a power supply. Batteries 440 may be replaceable by a user. Batteries 440 may be rechargeable.

Figure 5:
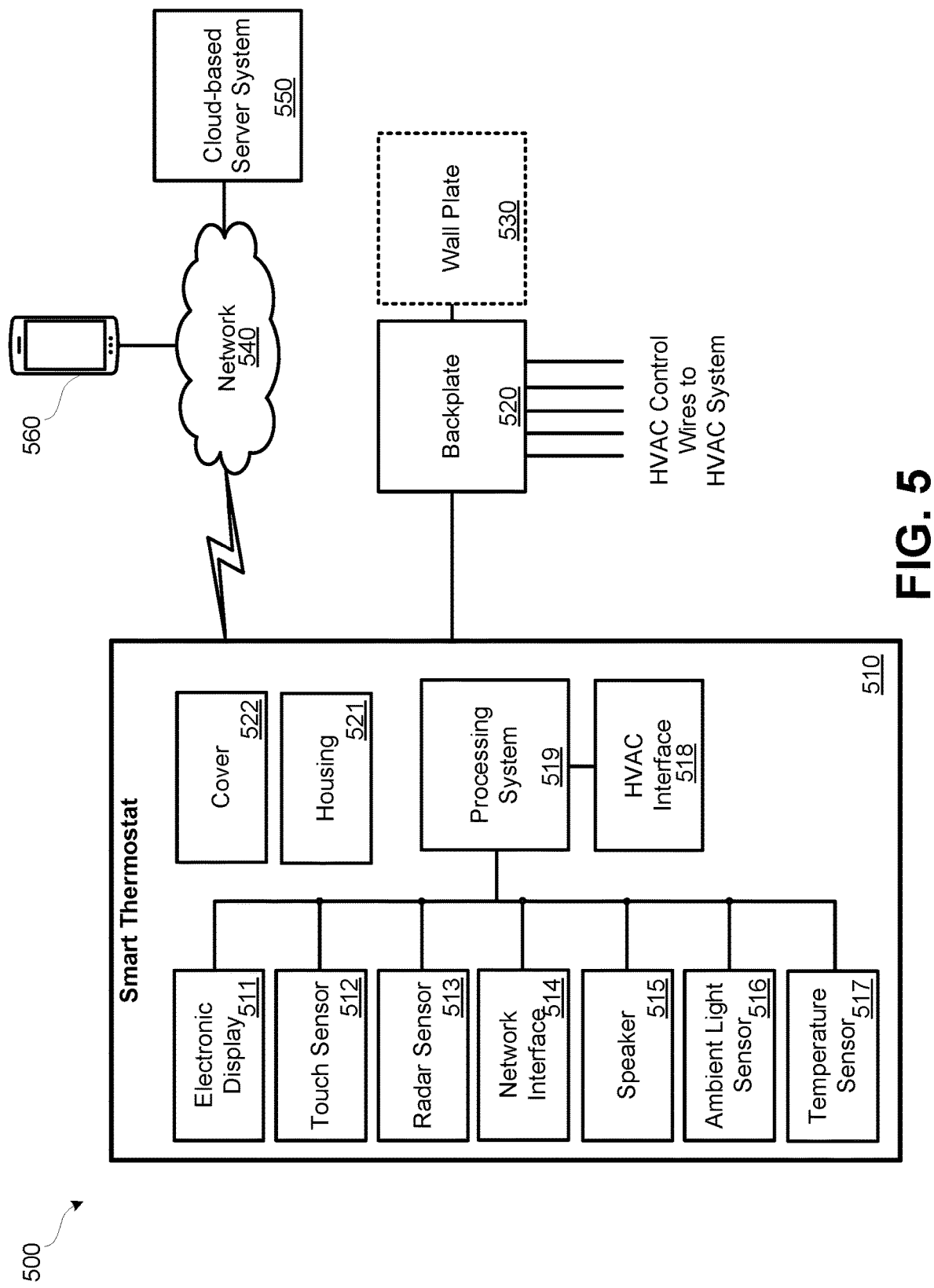
FIG. 5 illustrates a smart thermostat system, according to some embodiments.

FIG. 5 illustrates a smart thermostat system 500, according to some embodiments. Smart thermostat system 500 can include smart thermostat 510; backplate 520; trim plate 530; network 540; cloud-based server system 550; and computerized device 560. Smart thermostat 510 can represent any of the thermostats detailed in relation to FIGS. 1-4. Thermostat 510 can include: electronic display 511; touch sensor 512; radar sensor 513; network interface 514; speaker 515; ambient light sensor 516; temperature sensor 517; HVAC interface 518; processing system 519; housing 521; and cover 522.

Electronic display 511 may be visible through cover 522. In some embodiments, electronic display 511 is only visible when electronic display 511 is illuminated. In some embodiments, electronic display 511 is not a touch screen. Touch sensor 512 may allow one or more gestures, including tap and swipe gestures, to be detected. Touch sensor 512 may be a capacitive sensor that includes multiple electrodes. In some embodiments, touch sensor 512 is a touch strip that includes five or more electrodes.

Radar sensor 513 may be configured to output radio waves into the ambient environment in front of electronic display 511 of thermostat 510. Radar sensor 513 may be an integrated circuit that includes one or more antennas, one or more RF emitters, and one or more RF receivers. Radar sensor 513 may be able to detect the presence of a user and the distance at which the user is located. Radar sensor 513 may use frequency-modulated continuous wave (FMCW) radar. Radar sensor 513 may emit radio waves and receive reflected radio waves through cover 522. Radar sensor 513 may emit chirps of radar that sweep from a first frequency to a second frequency. Therefore, the waveform output by radar sensor 513 may be a saw tooth waveform. Using receive-side beam steering on the reflected radio waves received using multiple antennas, certain regions may be targeted for sensing the presence of users. For instance, beam steering away from the ground may be performed to avoid pets being potentially incorrectly detected as a user.

Network interface 514 may be used to communicate with one or more wired or wireless networks. Network interface 514 may communicate with a wireless local area network, such as a WiFi network. Additional or alternative network interfaces may also be present. For example, thermostat 510 may be able to communicate with a user device directly, such as using Bluetooth. Thermostat 510 may be able to communicate via a mesh network with various other home automation devices. Mesh networks may use relatively less power compared to wireless local area network-based communication, such as WiFi. In some embodiments, thermostat 510 can serve as an edge router that translates communications between a mesh network and a wireless network, such as a WiFi network. In some embodiments, a wired network interface may be present, such as to allow communication with a local area network (LAN). One or more direct wireless communication interfaces may also be present, such as to enable direct communication with a remote temperature sensor installed in a different housing external and distinct from housing 521. The evolution of wireless communication to fifth generation (5G) and sixth generation (6G) standards and technologies provides greater throughput with lower latency which enhances mobile broadband services. 5G and 6G technologies also provide new classes of services, over control and data channels, for vehicular networking (V2X), fixed wireless broadband, and the Internet of Things (IoT). Thermostat 510 may include one or more wireless interfaces that can communicate using 5G and/or 6G networks.

Speaker 515 can be used to output audio. Speaker 515 may be used to output beeps, clicks, or other audible sounds, such as in response to the detection of user input via touch sensor 512.

Ambient light sensor 516 may sense the amount of light present in the environment of thermostat 510. Measurements made by ambient light sensor 516 may be used to adjust the brightness of electronic display 511. In some embodiments, ambient light sensor 516 senses an amount of ambient light through cover 522. Therefore, compensation for the reflectivity of cover 522 may be made such that the ambient light levels are correctly determined via ambient light sensor 516. A light pipe may be present between ambient light sensor 516 and cover 522 such that in a particular region of cover 522, light that is transmitted through cover 522, is directed to ambient light sensor 516, which may be mounted to a printed circuit board (PCB), such as a PCB to which processing system 519 is attached.

One or more temperature sensors, such as temperature sensor 517, may be present within thermostat 510. Temperature sensor 517 may be used to measure the ambient temperature in the environment of thermostat 510. One or more additional temperature sensors that are remote from thermostat 510 may additionally or alternatively be used to measure the temperature of the ambient environment.

Cover 522 may have a transmissivity sufficient to allow illuminated portions of electronic display 511 to be viewed through cover 522 from an exterior of thermostat 510 by a user. Cover 522 may have a reflectivity sufficient such that portions of cover 522 that are not illuminated from behind appear to have a mirrored effect to a user viewing a front of thermostat 510.

HVAC interface 518 can include one or more interfaces that control whether a circuit involving various HVAC control wires that are connected either directly with thermostat 510 or with backplate 520 is completed. A heating system (e.g., furnace, heat pump), cooling system (e.g., air conditioner), and/or fan may be controlled via HVAC wires by opening and closing circuits that include the HVAC control wires.

Processing system 519 can include one or more processors. Processing system 519 may include one or more special-purpose or general-purpose processors. Such special-purpose processors may include processors that are specifically designed to perform the functions detailed herein. Such special-purpose processors may be ASICs or FPGAs which are general-purpose components that are physically and electrically configured to perform the functions detailed herein. Such general-purpose processors may execute special-purpose software that is stored using one or more non-transitory processor-readable mediums, such as random access memory (RAM), flash memory, a hard disk drive (HDD), or a solid state drive (SSD) of thermostat 510.

Processing system 519 may output information for presentation to electronic display 511. Processing system 519 can receive information from touch sensor 512, radar sensor 513, and ambient light sensor 516. Processing system 519 can perform bidirectional communication with network interface 514. Processing system 519 can output information to be output as sound to speaker 515. Processing system 519 can control the HVAC system via HVAC interface 518.

Housing 521 may house all of the components of thermostat 510. Touch sensor 512 may be interacted with a user through housing 521. Housing 521 may define a sidewall and an aperture, such as a rounded aperture (e.g., a circular aperture) in which cover 522 is present.

Thermostat 510 may be attached (and removed) from backplate 520. HVAC control wires may be attached with terminals or receptacles of backplate 520. Alternatively, such control wires may be directly connected with thermostat 510. In some embodiments, trim plate 530 may additionally be installed between backplate 520 and a surface, such as a wall, such as for aesthetic reasons (e.g., cover an unsightly hole through which HVAC wires protrude from the wall.

Network 540 can include one or more wireless networks, wired networks, public networks, private networks, and/or mesh networks. A home wireless local area network (e.g., a Wi-Fi network) may be part of network 540. Network 540 can include the Internet. Network 540 can include a mesh network, which may include one or more other smart home devices, may be used to enable thermostat 510 to communicate with another network, such as a Wi-Fi network. Thermostat 510 may function as an edge router that translates communications from a relatively low power mesh network received from other devices to another form of network, such as a relatively higher power network, such as a Wi-Fi network.

Cloud-based server system 550 can maintain an account mapped to smart thermostat 510. Thermostat 510 may periodically or intermittently communicate with cloud-based server system 550 to determine whether setpoint or schedule changes have been made. A user may interact with thermostat 510 via computerized device 560, which may be a mobile device, smartphone, tablet computer, laptop computer, desktop computer, or some other form of computerized device that can communicate with cloud-based server system 550 via network 540 or can communicate directly with thermostat 510 (e.g., via Bluetooth or some other device-to-device communication protocol). A user can interact with an application executed on computerized device 560 to control or interact with thermostat 510.

Temperature Compensation

Digital electronic thermostats have been used for years to regulate temperatures within enclosures, such as homes, office buildings, warehouses, and so forth. These digital electronic thermostats typically employ digital integrated circuits that control the flow of electric power to a Heating, Ventilation, and Air Conditioning (HVAC) system. Digital electronic circuits may include switching elements, rectifiers, and/or microprocessors. In some digital electronic thermostats, excessive internal heat may be generated when digital electronic components are in an active, operating state. Additionally, smart-home devices may include power supplies, HVAC solid-state-switching relays, radios, display backlights, and other components that also generate excessive heat. The generation of internal heat can interfere with the accurate measurement of ambient temperature within the enclosure as required for accurate temperature regulation. Heat generated by digital electronics may cause inaccuracies in the ambient temperature measurements. These inaccuracies may in turn affect the maintenance of a stable temperature within the enclosure.

The problem of estimating an accurate ambient temperature that is external to the thermostat has been exacerbated in recent years by the inclusion of advanced electronics and communication circuits in smart-home devices. For example, the thermostat 100 described above may include multiple microprocessors, active matrix displays, power regulators, Wi-Fi communication circuits, high-voltage relays, and other electronics that may generate a significant amount of heat during operation. To maintain the compact, integrated look and feel of the thermostat 100, the temperature sensors used to measure and estimate ambient temperature may be placed within the housing of the thermostat. When a raw temperature is measured by the internal temperature sensors, this measurement may generally be significantly higher than the actual ambient temperature outside of the thermostat. The heat-generated components inside the thermostat artificially raise the internal temperature of the thermostat around the internal temperature sensor(s), thereby causing the temperature sensor(s) to read a temperature that is higher than the external ambient temperature. Internal heating may occur by both direct radiation of heat from the heat-generating components that are near the temperature sensors, through general heating of the air in the internal environment of the thermostat 100 that is contained within the thermostat housing, and through conduction in wire traces, printed circuit board (PCB) substrates, and other physical components of the smart-home device.

Prior to this disclosure, thermostat manufacturers used various sensors and methods to calculate the ambient temperature in a home, often arriving at different ambient room temperature measurements. For example, some thermostats used external temperature sensors to read the ambient temperature outside of the thermostat. However, these required additional wireless communications or unsightly wired connections to the thermostat. External temperature sensors also generally interrupt the self-contained look-and-feel of a modern thermostat. Some thermostats may use multiple temperature sensors distributed in different locations inside the thermostat to estimate an external temperature. For example, a difference between a temperature measured by a sensor in the thermostat housing and a temperature measured by a sensor in the backplate may be scaled to linearly interpolate an external temperature. Alternatively, some thermostats used direct measurements of heat generated by internal components to compensate in a temperature-estimation algorithm. For example, thermocouples or other temperature sensors may be added to a circuit board adjacent (e.g., within 5 mm) to heat-generating components, and the measured temperature may be used to determine how to compensate the ambient temperature measured by the main temperature sensor.

Each of these methods provided some level of satisfactory results in certain situations. However, each of these methods relied on a secondary measurement of thermal energy that was dissipated within the thermostat. For example, multiple internal temperature sensors or thermocouples only measure the secondary effect of heat generated by the internal components. Measuring heat surrounding a component necessarily loses some level of precision due to heat being radiated in different directions, heat being absorbed by the circuit board, interference from heat generated by other nearby components, loss of heat through the thermostat housing, and so forth. Therefore, improvements are needed in this technology area to rely instead on a primary measure of energy dissipated in the thermostat rather than secondary measurements of radiated heat.

Embodiments described herein directly measure the power being used by the thermostat that is converted into heat energy instead of inferring an amount of heat generated by measuring the heat in the thermostat housing. From a physics perspective, measuring the energy converted into heat is much more accurate and reliable than attempting to measure the resulting generated heat itself. Therefore, the thermostat 100 may be equipped with devices and algorithms to measure the precise amount of power being dissipated by the device. The thermostat 100 also "knows" exactly which components are active at any given moment. By knowing the amount of energy that is consumed by specific components, the thermostat 100 can more accurately estimate the effect on the temperature measured by the internal temperature sensor(s). Once this effect is known, the measured ambient temperature may be compensated to more accurately estimate the external ambient temperature. Essentially, rather than measuring the results of self-heating, these embodiments measure the cause of the self-heating, which generates more accurate results that are more predictive rather than reactive.

Figure 6:
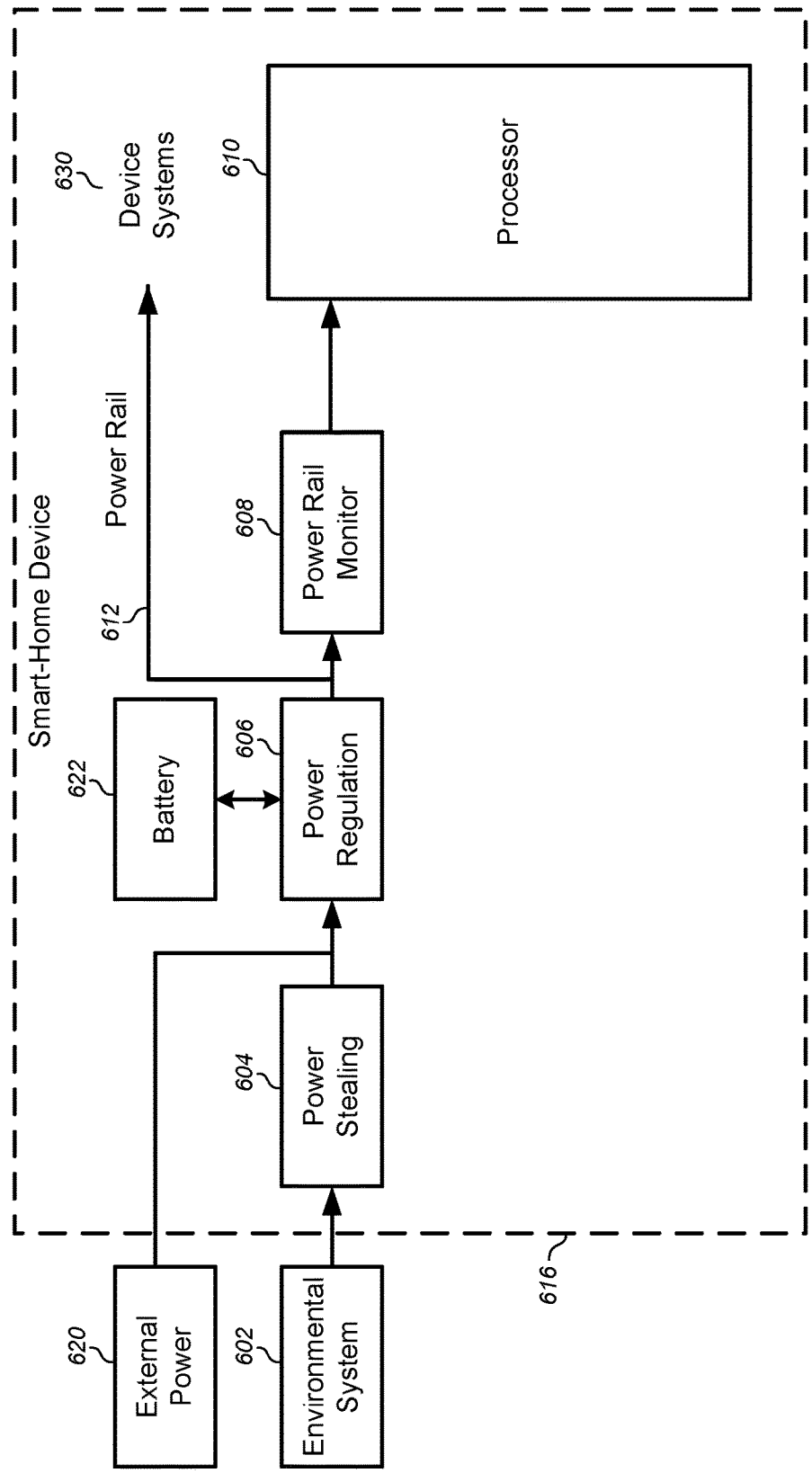
FIG. 6 illustrates a simplified block diagram of a smart-home device enabled to measure power consumed from an internal power rail, according to some embodiments.

FIG. 6 illustrates a simplified block diagram of a smart-home device 616 enabled to measure power consumed from an internal power rail, according to some embodiments. The smart-home device 616 may be implemented using any smart-home device that may be installed in a network-connected, smart-home environment. For example, the smart-home device 616 may be implemented using a thermostat. Other embodiments may use other smart-home devices such as hazard detectors, doorbells, motion sensors, video cameras, intercom systems, security systems, smart-appliances, Internet gateways, and/or any other smart-home devices. Throughout this disclosure, a thermostat may be used as an example of a smart-home device 616. However, the principles and inventive concepts disclosed herein may be used on any smart-home device.

The smart-home device 616 may operate using power generated and/or stored from one or more different sources. For simplicity, the input power from one of these power sources may be regulated to a desired voltage and represented as a power rail 612 in FIG. 6. The power rail 612 may provide operating power to one or more processors 610, an active display for a user interface, wireless communication circuits, and/or other subsystems on the smart-home device 616. To generate the power rail 612, the device may send the input power through a power regulation circuit 606. The power regulation circuit 606 may include a buck converter or other power converter that stabilizes the input power and provides a steady voltage.

In some embodiments, the power regulation circuit 606 may optionally and/or periodically receive power from an internal battery 622. The battery 622 may be a rechargeable battery, a replaceable battery, or any other power storage device, such as a large capacitor or a super capacitor. Some embodiments may additionally or alternatively receive power from an external power source 620. The external power source 620 may include AC power from a home's electrical system. The external power source 620 may additionally or alternatively include a power line from an environmental system 602, such as a C wire from an HVAC system. In some environments, the environmental system 602 may be controlled by the smart-home device 616. For example, an HVAC system may be controlled by a thermostat. The smart-home device 616 may steal power directly from the environmental system 602. For example, a thermostat may steal power from an HVAC power line that is used to activate various HVAC functions. "Inactive" power stealing may take place when the environmental system 602 is off, and "active" power stealing may take place when the environmental system 602 is on. A power stealing circuit 604 may control the timing and operation of this power stealing function. In some embodiments, when the external power 620 is provided through a C wire of an HVAC system, the C wire connection may also run through a power stealing circuit 604. Any of these different types of power supplies 602, 620, 622 may provide input power to the power regulation circuit 606 and may thus generate the power rail 612 for powering the internal systems of the smart-home device 616. In FIG. 6, the power rail 612 delivers power to the device systems 630. The device systems 630 may include any chip, processor, memory, display, radio, and/or other power-consuming component of the smart-home device 616. Note that the device systems 630 may include the processor 610, which is separately displayed in FIG. 6.

In order to estimate and predict the amount of heat generated internally by the smart-home device 616, the smart-home device 616 may include a power rail monitor 608. The power rail monitor 608 may include a circuit that is configured to measure an amount of power output by the power regulation circuit 606 that is consumed by various subsystems in the smart-home device 616. The power rail monitor 608 may provide an instantaneous, real-time measurement of power that is consumed by the smart-home device 616. This value may be used as an input to an algorithm or model that is used to then predict an amount of internal heating that may be attributed to the power consumption of the smart-home device 616. For example, the smart-home device 616 may be characterized such that a measurement from the power rail monitor 608 may be scaled, multiplied, and/or otherwise processed using a trained model to estimate a corresponding output of heat that may be generated internally.

Note that the power rail monitor 608 in FIG. 6 measures power provided to the power rail 612 from any of the different power sources 602, 620, 622. In other embodiments not explicitly illustrated in FIG. 6, power monitors may be provided and configured to measure power provided by each of the power sources 602, 620, 622 individually. The instantaneous measurements from each of these different power monitors for each of the power sources 602, 620, 622 may then be considered collectively and aggregated by the processor 610 to determine a total power usage of the smart-on device 616.

The power rail monitor 608 may be used alone to estimate an internal heating of the smart-home device 616 based on the overall power consumption. Additionally, as described below, the power rail monitor 608 may be one of many different inputs received by a processor 610 that may be used to predict an internal heating effect. Instead of relying solely on the total power consumption of the smart-home device 616, some embodiments may augment this measurement with additional power measurements or power estimations of specific subsystems throughout the smart-home device 616. These additional inputs may be measurements made by the subsystems themselves or estimates of power usage by the subsystems by the processor 610.

In some embodiments, the power rail monitor 608 may measure both the voltage and/or the current provided by the power rail 612. This may be useful in cases where the battery 622 may provide a different voltage than the power-stealing circuit 604. As the total power is the product of the voltage and the current, knowing the instantaneous values of both may more accurately characterize the actual power consumed by the smart-home device 616.

In order to accurately measure the instantaneous power consumption of the main power rail in real time, new circuit has been developed that is able to capture the fast, transient peaks that may occur in the current usage on the main power line. As various subsystems switch on and off in the smart-home device 616, the instantaneous current drawn from the main power line may change very dynamically. Therefore, this disclosure introduces an integration-based current measurement circuit for accurately measuring power usage from the main power rail. This disclosure first describes the power system of an example smart-home device 616, and then describes example implantations and integrating power line monitor.

Figure 7:
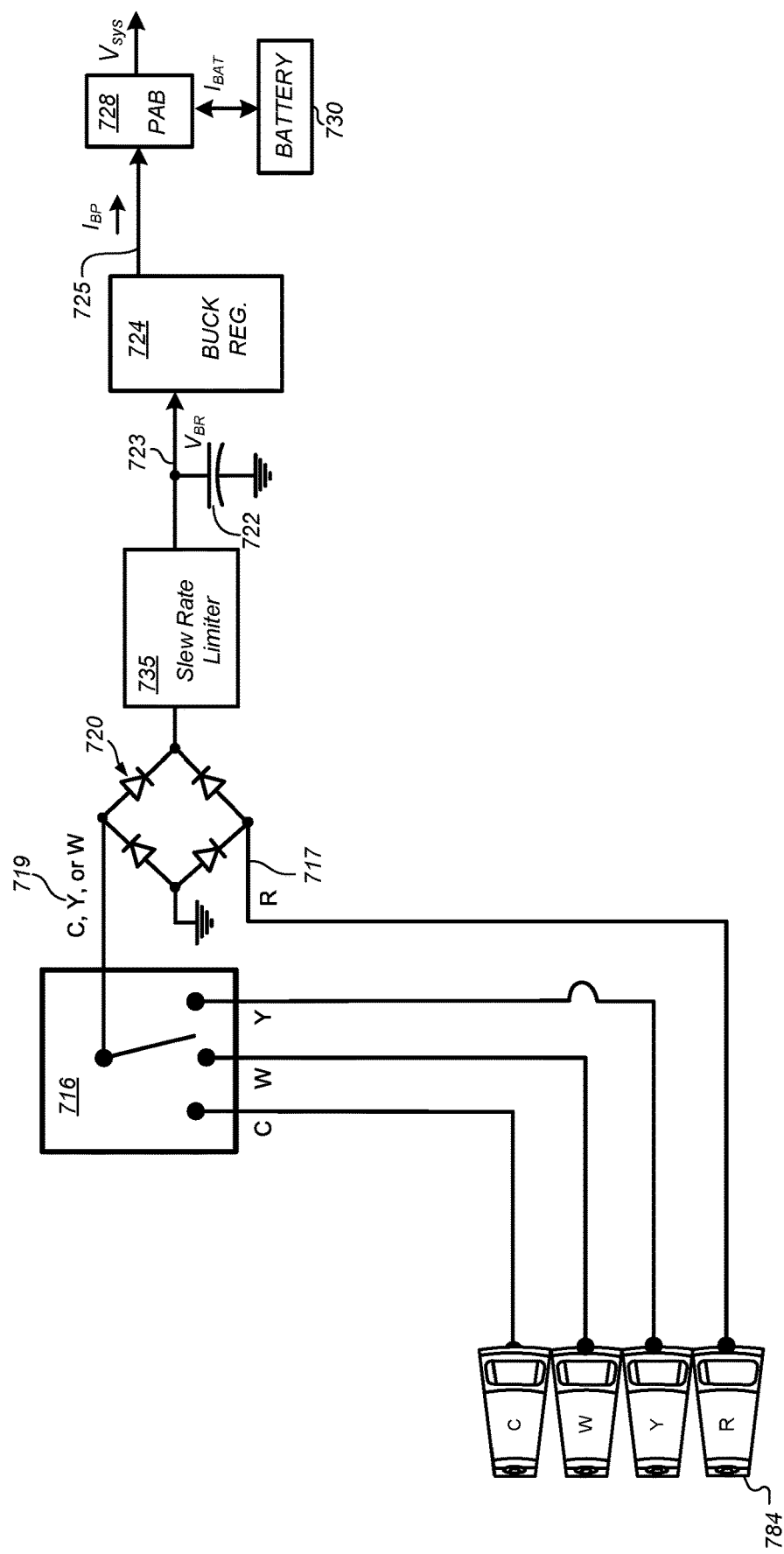
FIG. 7 illustrates a power management and power harvesting system for a smart thermostat, according to some embodiments.

FIG. 7 illustrates a power management and power harvesting system for a smart thermostat, according to some embodiments. FIG. 7 shows plurality of wire connectors 784 to common HVAC wiring, such as a W (heat call relay wire); Y (cooling call relay wire); R (heat/cooling call relay power); and C (common wire). Note that the wiring connectors 784 may include other wire connectors that are not shown explicitly in FIG. 7, such as an AUX connector, an O/B connector, a G connector, a HUM connector, a Y2 connector, and so forth. However, these additional wiring connectors have been omitted from FIG. 7 for clarity and in order to focus on the power-stealing inputs used by the power stealing circuitry. Additionally, the Rc and Rh terminals are represented as the R terminal, since some embodiments may automatically jumper these two wire connectors together unless separate wires are inserted in each of the Rc and Rh terminals. Therefore, this disclosure may refer to the R terminal to include either or both of the Rc and Rh terminals.

Although not shown explicitly in FIG. 7, the thermostat may also include a relatively high-power primary processor, such as an AM3703 Sitara ARM microprocessor available from Texas Instruments, the i.MX 6SoloX ARM microprocessor available from NXP, and/or the i.MX 6UltraLite also available from NXP, that provides the main general governance of the operation of the thermostat. The thermostat may also include a secondary processor which may comprise, for example, an STM32L 32-bit ultra-low power ARM-based microprocessor available from ST Microelectronics, or the MIMXRT1061VDL6B MCU from NXP Semiconductor. This secondary processor is optional.

Thermostat may also include powering circuitry. Generally speaking, it is the purpose of the powering circuitry to extract electrical operating power from the HVAC wires and convert that power into a usable form for the many electrically-driven components of the thermostat 100. With respect to the HVAC wiring connectors 784 that are dedicated to the C, W, Y, and R terminals, those dedicated electrical switches are, in turn, networked together in a manner that yields the results that are illustrated in FIG. 7 by block 716. The output of block 716, which is provided at a node 719, may be dictated by mechanical causation switches that automatically sent mechanical insertions of wires into the wire connectors. The output of block 716 may also be selected by virtue of electrical switches or varying voltage drops across diode bridges, or programmatically using commands from the processor.

The powering circuitry may include a full-wave bridge rectifier 720, a storage and waveform-smoothing bridge output capacitor 722 (which can be, for example, on the order of 30-35 microfarads) and a buck regulator circuit system 724. Note that the powering circuitry may include other elements, such as a power-and-battery (PAB) regulation circuit 728, and a rechargeable or non-rechargeable battery 730. Power stolen from the wires selected by block 716 may pass through a slew rate limiter 735 and charge the output capacitor 722. Charge from the output capacitor 722 may be provided to the buck regulator 724, which may in turn provide a rectified voltage output 725 to operate the thermostat and/or to charge a battery in cases where a rechargeable battery or super capacitor is used.

As illustrated in FIG. 7, the powering circuitry generally serves to provide the voltage $V_{sys}$ that is used by the various electrical components of the thermostat 100, and that in one embodiment will usually be about 3.7V~3.95V. The general purpose of powering circuitry is to convert the 24 VAC presented between the HVAC wiring connectors to a steady DC voltage output at the Vcc MAIN node to supply the thermostat electrical power load.

Figure 8:
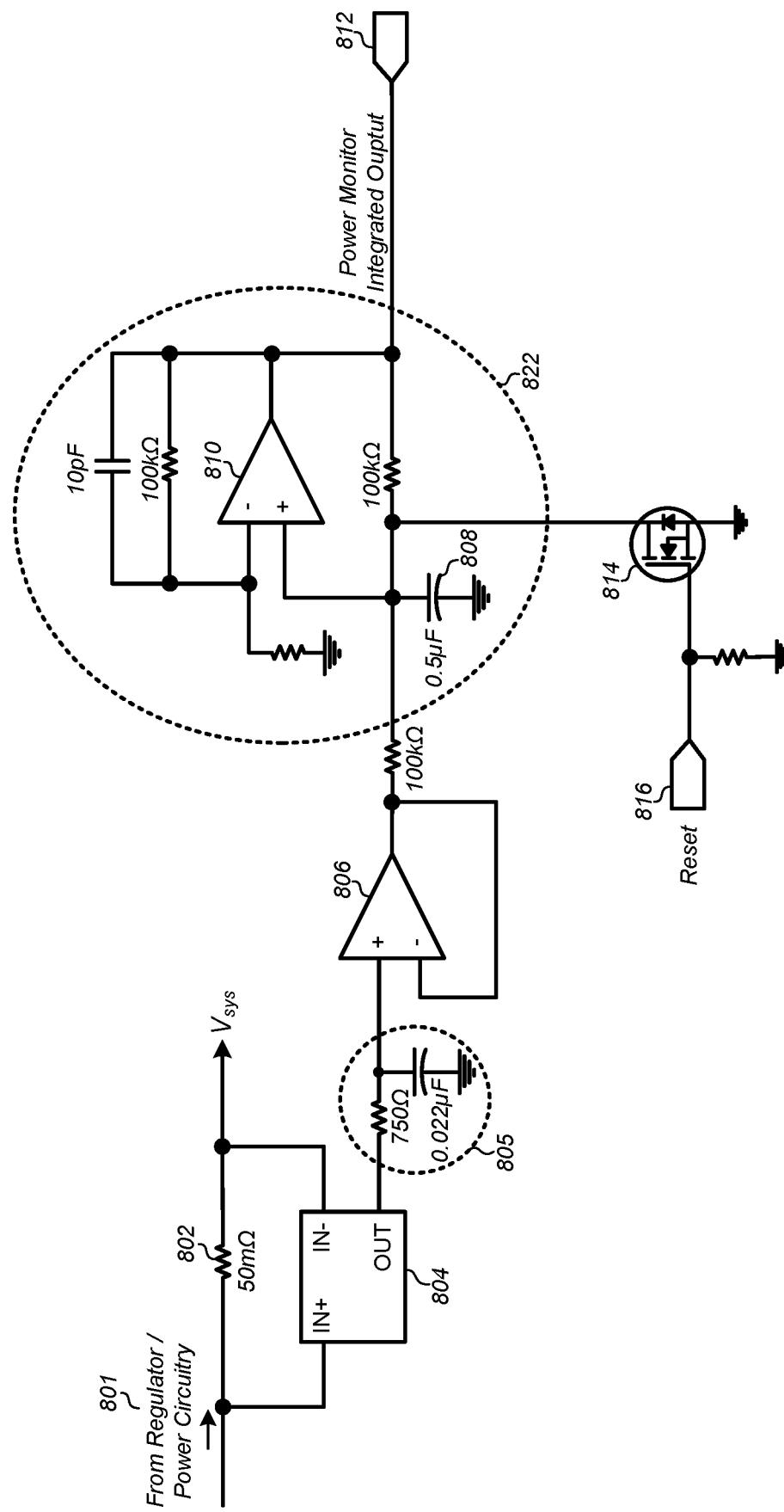
FIG. 8 illustrates an example circuit diagram of a power rail monitor, according to some embodiments.

FIG. 8 illustrates an example circuit diagram of a power rail monitor 608, according to some embodiments. At the output of the power circuitry, a small resistor 802 may be placed in line with the main power rail that provides the system voltage, $V_{sys}$ to the smart-home device. The voltage drop across the resistor 802 may be fed into the two inputs of a current sense amplifier 804. In some embodiments, the current sense amplifier 804 may be implemented using the INA216A2YFFR 1.8 to 5.5V, high-precision current sense amplifier from Texas Instruments®, along with any other similar component. The current sense amplifier 804 may magnify the small voltage differential that may exist across the resistor 802 due to the current flowing to the subsystems of the smart-home device through the resistor 802. As described above, the main power rail may provide power to one or more subsystems or components of the smart-home device, such as a processor, a wireless communication device, a user interface, screen, and so forth.

The output of the current sense amplifier 804 may then pass through a low-pass filter 805. The component values illustrated in FIG. 8 may be used to provide a sufficient amount of filtering, while still allowing for the capture of transient current spikes that are part of the normal operation of the smart-home device. Although not shown explicitly in FIG. 8, the filtered output of the low-pass filter may be selectively provided as an output that may be read by the microprocessor or by an analog-to-digital converter. Although not shown explicitly in FIG. 8, some embodiments may move the low-pass filter 805 to the input of the current sense amplifier 804 instead of the output.

The output of the low-pass filter may also be passed to a unity gain analog buffer 806 to boost the current provided by the output of the current sense amplifier 804. The analog buffer 806 may be implemented using, for example, the TLV9002SIRUGR 2-Channel, 1 MHz, RRIO, 1.8V to 5.5V Operational Amplifier from Texas Instruments®, along with any other similar component.

After passing through the buffer 806, the output of the buffer may be passed as an input to an amplifier 810 in an integrating configuration. The amplifier 810 may be implemented using, for example, the TLV9002SIRUGR 2-Channel, 1 MHz, RRIO, 1.8V to 5.5V Operational Amplifier from Texas Instruments®, along with any other similar component. In this case, the operational amplifier 810 may be configured as an integrator such that the integrated output is stored on an energy-storage device, such as an integration capacitor 808. Thus, the charge stored on the integration capacitor 808 may represent an integrated total representing the current on the main power line over a defined time interval. The combination of components, including the amplifier 810, the storage capacitor, and other resistances/capacitances illustrated in FIG. 8 may be referred to simply as an integrator 822. The integrator 822 may be implemented using other components or configurations known in the art to perform an integration function of an input signal over time.

The output of the integration capacitor 808 may be passed as an input 812 to an analog-to-digital converter (ADC) such that the value on the integration capacitor 808 may be read by the processor of the smart-home device. As described below, the processor may also provide a reset signal 816 that causes a transistor 814 to conduct and thus reset the value on the integration capacitor 808. For example, as the value on the integration capacitor 808 reaches a numerical limit of an ADC of the processor, the processor can reset the ADC and the value on the integration capacitor 808 while incrementing a counter that tracks the number of times a reset operation has occurred.

Figure 9:
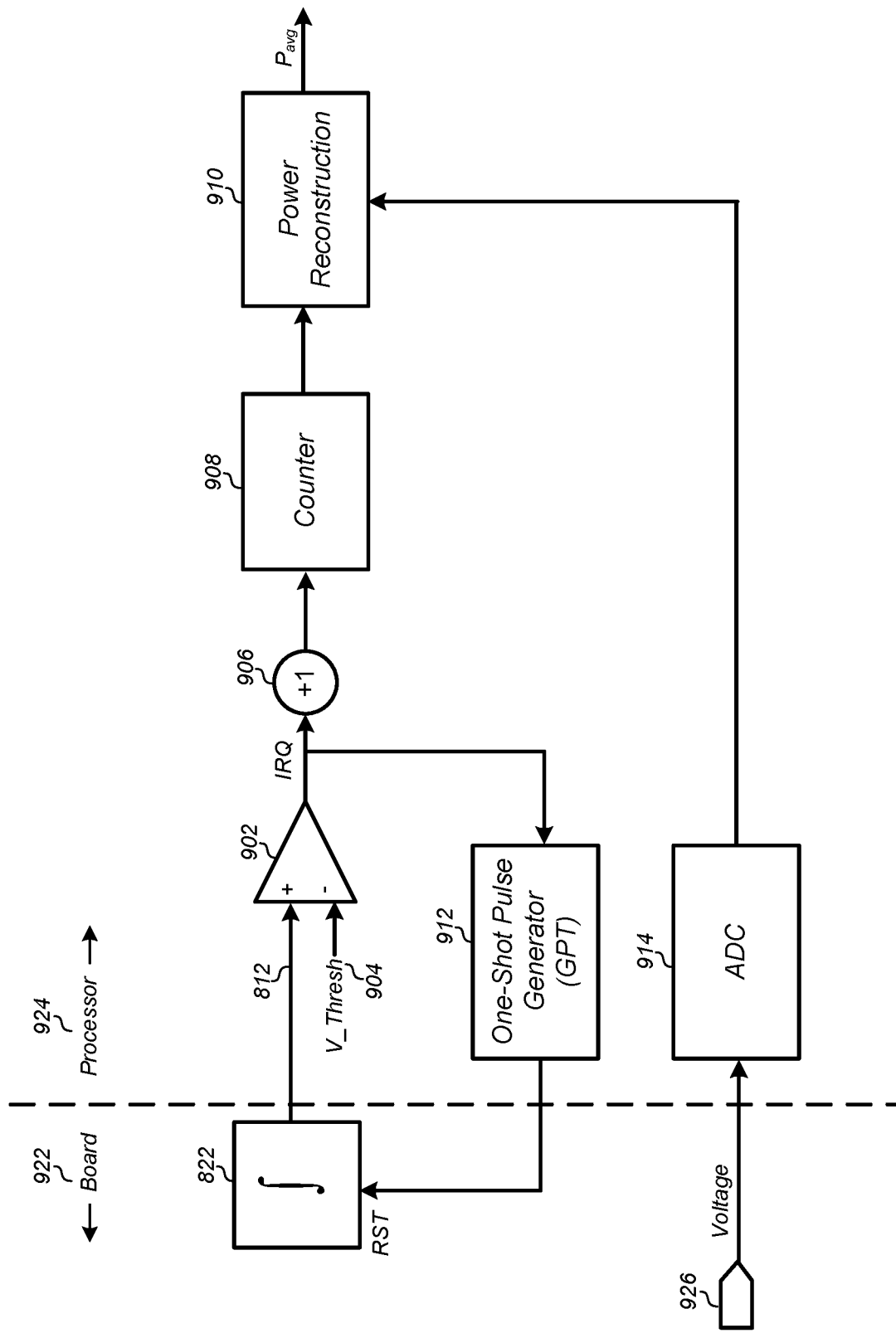
FIG. 9 illustrates a block diagram of a system for reconstructing an average power usage from the integration circuit described above in FIG. 8, according to some embodiments.

FIG. 9 illustrates a block diagram of a system for reconstructing an average power usage from the integration circuit described above in FIG. 8, according to some embodiments. The integrator 822 from FIG. 8 may provide an output 812 to an analog comparator 902. A second input of the analog comparator 902 may receive a threshold voltage 904. The threshold voltage 904 may be configured to be at or near a maximum voltage for an ADC 914. When the voltage output from the integrator 822 exceeds the voltage threshold 904, the comparator 902 may generate an output. The output from the comparator 902 may indicate that the value integrated by the integrator 822 is reaching a maximum value. The interval during which the energy-storage device in the integrator 822 begins at 0 and increases to this maximum value before being reset may be referred to as an integration cycle of the integrator 822. Essentially, an integration cycle may include one cycle of filling the capacitor 808 in the integrator 822.

This power monitoring circuit has the ability to monitor power usage over extended periods of time. Therefore, the circuit is configured to handle a plurality of integration cycles. When the output is generated by the comparator 902, the output may be received by a one-shot pulse generator 912, which may generate a reset signal that resets the value on the energy storage device as described above. This may essentially end the current integration cycle and begin a subsequent integration cycle for the integrator 822. The output of the comparator 902 may also increment 906 a value stored in a counter 908. The value in the counter 908 may thus represent a number of integration cycles during a current time interval.

In addition to tracking the number of complete integration cycles performed by the integrator 822, the circuit may also receive a measurement from the integrator 822. For example, an electrical measurement of the energy-storage device, such as a voltage measurement of the capacitor 808 may be used provided as an input to the ADC 914. The ADC may then generate a digital representation of the energy stored on the energy-storage device of the integrator 822.

In order to reconstruct a power measurement, a power reconstruction process may receive the total number of integration cycles from the counter 908 and/or the value of the energy-storage device in the current integration cycle from the ADC 914. The full-scale value of the ADC 914 may be a known value. For example, the total power provided to the main power rail during a single integration cycle may be a known value. This value may be multiplied by the number of integration cycles stored in the counter 908 to derive a total energy, and may be divided by a length of the time interval to derive average power. Additionally, some embodiments may add a power measurement value represented by the current value stored on the capacitor 808 and converted in the ADC 914. The integration cycles and capacitor measurement may represent a total energy provided during the time interval that included multiple integration cycles. Dividing this amount by the length of the current time interval may provide an average power provided by the main power rail. Additional power statistics may be mathematically derived by the power reconstruction process 910, such as instantaneous power, by sampling the values from the counter 908 and/or the ADC 914 at regular intervals. In some alternate embodiments, and ADC may directly reference the integration capacitor 808.

In other embodiments, the capacitance of the storage capacitor may be relatively small such that the full-scale value of the ADC 914 may be reached in a relatively short time interval. This may cause the comparator 902 to trigger its reset output very frequently. While in the examples above, the value from the ADC 914 may be comparable to the power value derived from the counter 908. However, with a smaller capacitance, these embodiments may instead use smaller, more frequent integration cycles such that the power calculation is dominated by the value in the counter 908. Instead of adding the ADC value 914 to a relatively small number of complete integration cycles, the power estimation may be calculated primarily from the number of integration cycles itself. Either of these methods may be used by the circuit in FIG. 9 by changing the voltage threshold 904 and/or other discrete components illustrated in FIG. 8. For example, this alternate embodiment allows a smaller capacitance value to be used for the storage capacitor 808, which in turn may have a much more stable dielectric compared to larger capacitance values.

FIG. 9 illustrates that the integrator 822 and other discrete components from FIG. 8 may be implemented using board-level components and/or integrated circuits on a circuit board 922. In contrast, the comparator 902, incrementer 906, counter 908, power reconstruction process 910, one-shot pulse generator 912, and/or ADC 914 may be implemented as part of the onboard systems of a microprocessor 924. However, not all embodiments are limited in this fashion. Other embodiments may implement any of the functions in FIG. 9 that are part of the processor 924 as board-level components on the circuit board 922 in any combination and without limitation. Similarly, any of the functions that are part of the circuit board 922 in FIG. 8 and/or FIG. 9 may be implemented by onboard systems of a microprocessor 924.

Figure 10:
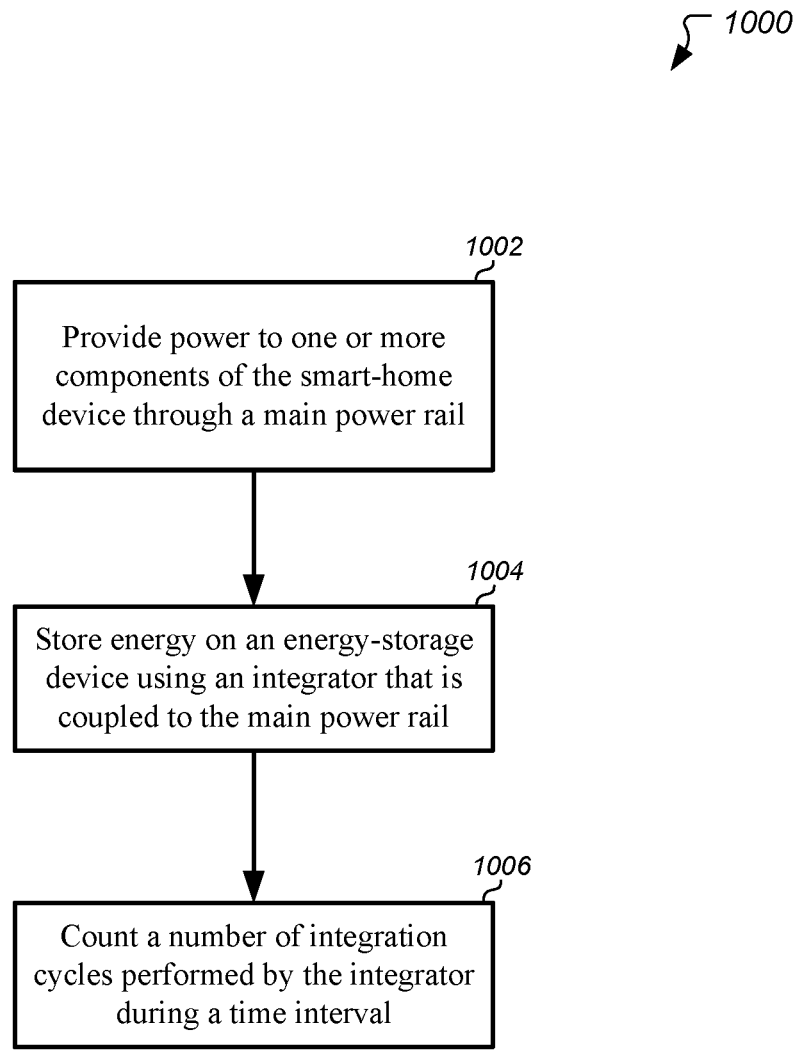
FIG. 10 illustrates a flowchart of a method for measuring an amount of power provided to a smart-home device through a main power rail, according to some embodiments.

FIG. 10 illustrates a flowchart of a method for measuring an amount of power provided to a smart-home device through a main power rail, according to some embodiments. The method may include providing power to one or more components of the smart-home device through a main power rail (1002). The main power rail may be provided as an output from a rectifier, DC/DC converter, and/or any other power regulation circuit. The smart-home device may include a temperature sensor or other environmental sensor for measuring an environmental condition around the smart-home device.

The method may also include storing energy on energy-storage device using an integrator that is coupled to the main power rail (1004). The energy stored on the energy-storage device may be representative of an amount of power provided to the smart-home device through the main power rail during an integration cycle of the integrator as described above. The integrator may be implemented using an operational amplifier, a capacitor, and/or any other circuit that may be configured to integrate a signal. The integration cycle may begin when the integrator begins storing energy on the energy-storage device and may end when an electrical measurement limit is reached for the energy storage device.

The method may additionally include counting a number of integration cycles performed by the integrator during a time interval (1006). A total amount of power provided to the smart-home device to the main power rail during the time interval may be represented by the number of integration cycles performed by the integrator during the time interval, along with (optionally) the energy currently stored on the energy-storage device. For example, the value on the capacitor can be used to derive an amount of current received. This may be multiplied by the voltage of the main power rail to derive power. The voltage of the main power rail may be measured by the ADC, or a known value may be used as a pre-stored average value for this calculation.

It should be appreciated that the specific steps illustrated in FIG. 10 provide particular methods of measuring power usage according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Many variations, modifications, and alternatives also fall within the scope of this disclosure.

Figure 11:
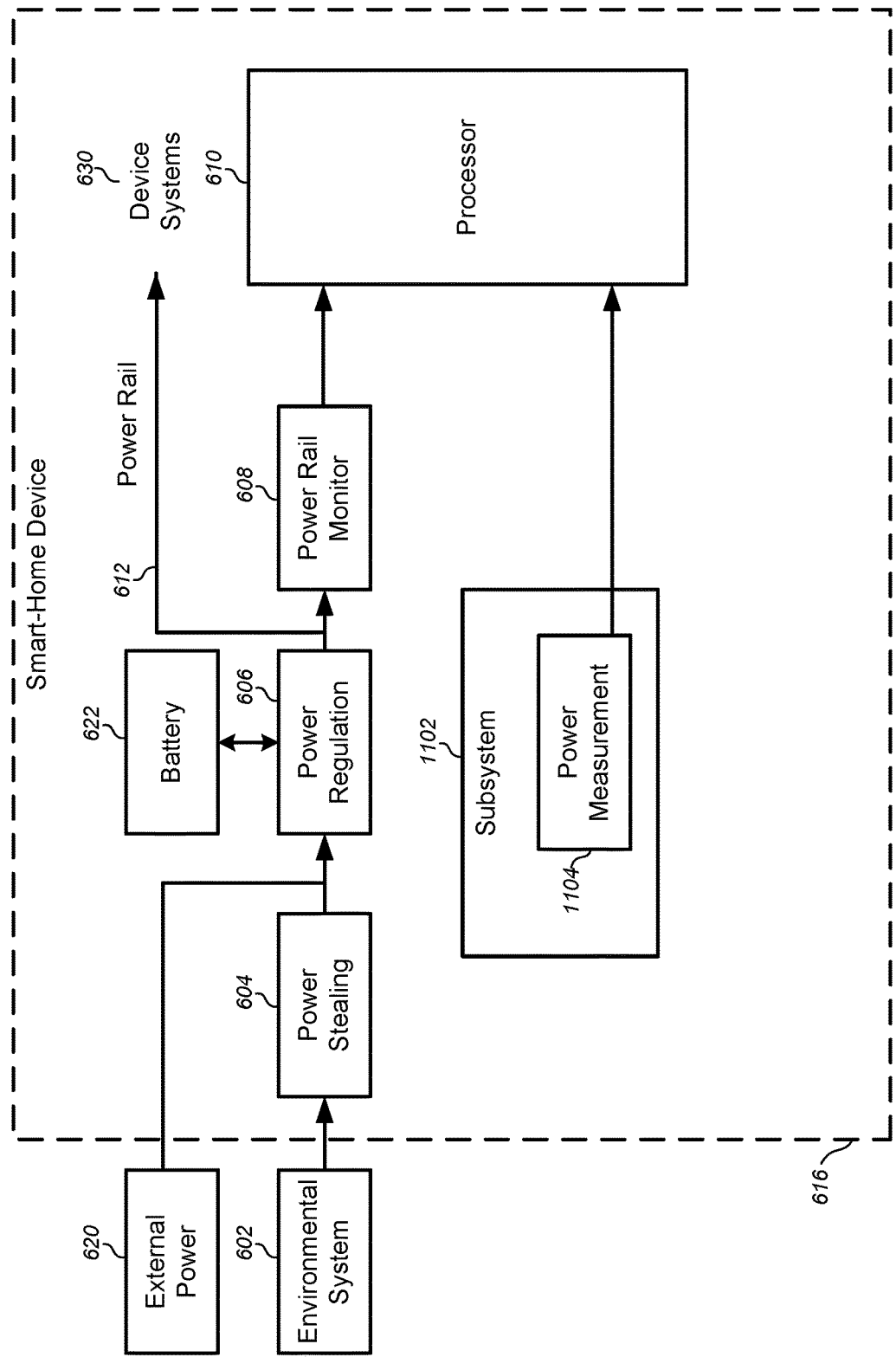
FIG. 11 illustrates a simplified block diagram of the smart-home device that is configured to measure power directly used by a subsystem on the smart-home device, according to some embodiments.

FIG. 11 illustrates a simplified block diagram of the smart-home device 616 that is configured to measure power directly used by a subsystem on the smart-home device 616, according to some embodiments. In addition to the power rail monitor 608 described above that measures a total power consumption for the smart-home device 616, some embodiments may also include individual power measurement circuits that are configured to measure power consumption for individual subsystems in the smart-home device 616. The power consumption measured for individual subsystems may then be used as another input to a model or algorithm for estimating an effective internal heat generation.

Different subsystems in the smart-home device 616 may operate with different power consumption requirements, and may have different efficiencies for converting the power consumed into a primary function of the subsystem as opposed to generating heat as a byproduct. A power measurement circuit 1104 may be integrated with, or coupled to a specific subsystem 1102 to provide a power measurement for that particular subsystem 1102. For example, the power measurement circuit 1104 may be placed at a power input of the subsystem 1102. As the subsystem 1102 is activated, the subsystem 1102 may begin to draw more power from the power rail 612. The power measurement circuit 1104 at the input of the subsystem 1102 may measure the total instantaneous power usage of the subsystem 1102 and report that measurement back to the processor 610.

Alternatively, the power measurement circuit 1104 may be integrated with the subsystem 1102 internally. For example, the subsystem 1102 may include an integrated circuit that provides internal telemetry systems that measure voltage, current, temperature, and/or other electrical characteristics of the subsystem 1102 as it operates. The telemetry measurements by the internal power measurement circuit 1104 may also be provided to the processor 610 to characterize the power usage of the subsystem 1102. For example, the commonly assigned U.S. Pat. No. 10,557,640, which is incorporated herein by reference in its entirety, describes a solid-state switching integrated circuit with onboard telemetry systems that measure the voltage/current used by the integrated circuit. These voltage/current telemetry measurements may be passed to the processor 610 and used to calculate a real-time, instantaneous power usage of the subsystem 1102.

The processor 610 may use the power measurement from the power measurement circuit 1104 as an additional input to an algorithm or model for predicting the effect of internal heating on the temperature measurements of the smart-home device 616. In some embodiments, the power efficiency of the subsystem 1102 may be taken into account to scale measured power usage by the power measurement circuit 1104. For example, the efficiency of an LED will typically be less than 100%. The power provided to the subsystem 1102 (e.g., the LED) may be measured by the power measurement circuit 1104. However, to predict the total heat generated by the subsystem 1102, the power measured by the power measurement circuit 1104 may be scaled or otherwise altered based on a known or characterized power efficiency of the subsystem 1102. For example, if the LED is 50% efficient, the power measured by the power measurement circuit 1104 may be scaled by 0.50 to determine the amount of power used by the LED that is translated into heat.

The subsystem 1102 may be characterized during testing to determine how much input power is efficiently used for the main function of the subsystem 1102 as opposed to being converted into heat as a byproduct. Different amounts of power may be applied to the subsystem 1102 in a testing scenario, the resulting heat generated may be measured, and an efficiency for the subsystem 1102 may be calculated. Alternatively, the subsystem 1102 may be placed in different operating states, and the internal power usage may be measured by the power measurement circuit 1104. A table may be stored at the processor 610 that relates and amounts of power measured by the power management circuit 1104 to a consequential output of heat generated by the subsystem 1102. In other embodiments, equations or models may be fitted to the measured heat such that the output of the power measurement circuit 1104 may be provided as an input to the model or equation to output the predicted amount of heat generated by the subsystem 1102.

This type of electrical characterization may be useful for systems that only convert a portion of the power used into heat. As described in the example above, an LED output may convert most of the power used into light energy, with only a small amount being converted into heat. The electrical characterization of the LED can provide a scaler or multiplier that can be used to determine how much power input to the subsystem 1102 is converted into heat. Since the efficiency of each subsystem may be different, each subsystem that relies on this method of heat prediction may be characterized separately in a testing or laboratory environment. Characterization may be particularly important for circuits such as power converters where there is an efficiency loss when generating the power rail 612. These efficiency losses may be characterized for AC/DC converters as well as DC/DC converters.

The power measurement circuit 1104 may be implemented using any known method of measuring power in electric circuits. For example, most subsystems in the smart-home device 616 may be supplied power through a main power rail with a known voltage. An ammeter (e.g., voltage drop across a known resistance) may be used to measure a current draw of the subsystem 1102, and the measured current may be multiplied by the known voltage to calculate the power input. Alternatively, an ammeter may be paired with a voltage measurement to measure both input voltage and current for calculating power usage. Current/voltage measurements may be made using known resistance values in voltage divider circuits to measure voltages across resistances to determine the resulting current. Some embodiments may use an off-the-shelf current/power monitor device that integrates over time and sends the resulting data to the processor 610 through a communication bus (e.g., $I^2C$).

The smart-home device 616 may include any type of smart-home device. Although a thermostat is used in this disclosure as an example, these methods, circuits, systems, and algorithms may be implemented in any smart-home device that makes an environmental measurement that may be affected by the internal operation of the device itself. For example, a humidity measurement from an internal humidity sensor may be affected by heat generated by internal device components. As the heat increases, the humidity inside the device may also increase, thereby affecting the humidity measurement. In another example, a device may monitor surrounding sounds for voice commands, security related noises (e.g., glass breaking), or other recognizable sounds. Noise generated by the operation of the device may affect the sound received by a device microphone, thereby requiring similar compensation. Temperature may also be measured by devices besides thermostats. For example, a digital home assistant may include an onboard temperature sensor and other environmental sensors to respond when users ask "How warm is it in here?" Although these digital home assistants need not necessarily control an HVAC system, these onboard temperature measurements may also be affected by self-heating. Therefore, the circuits and algorithms described herein may be applied to any smart-home device, making any type of environmental measurement without limitation.

Figure 12:
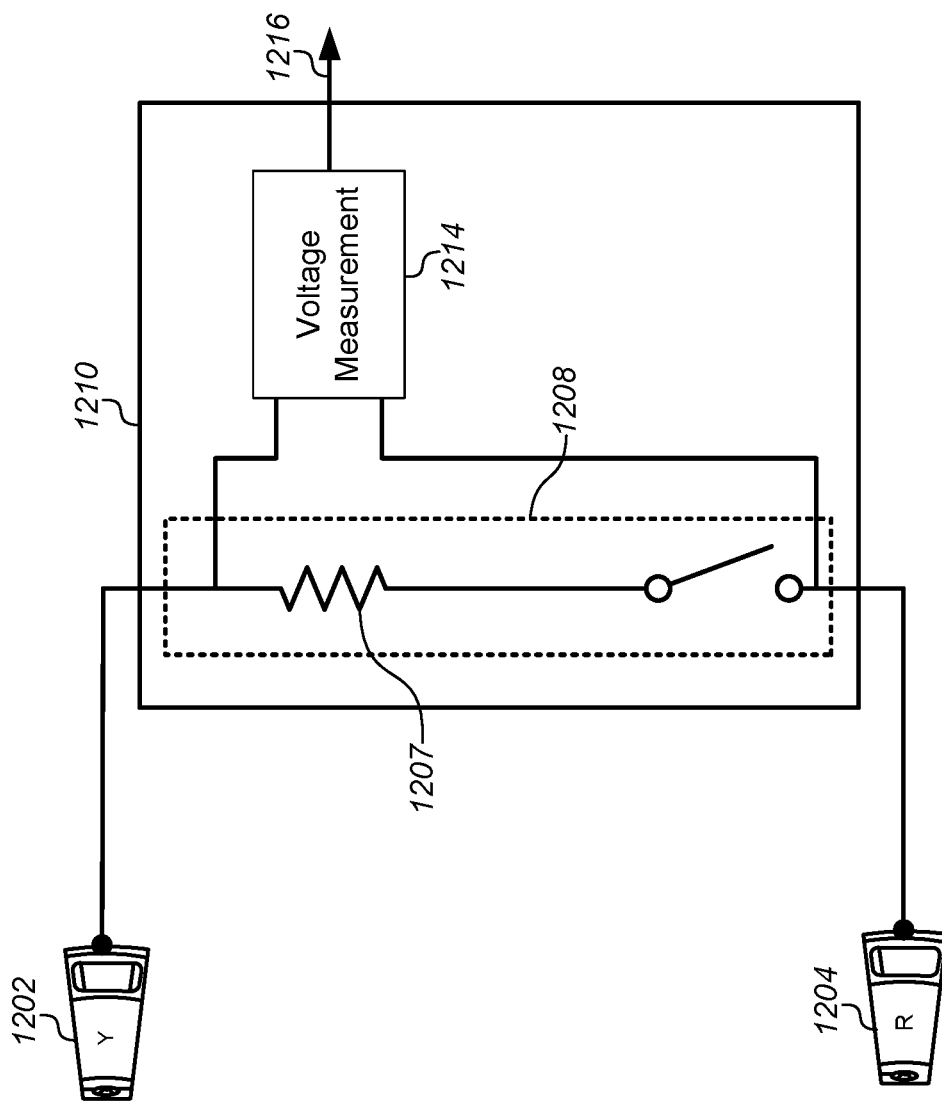
FIG. 12 illustrates an example of a subsystem with an internal power measurement circuit, according to some embodiments.

FIG. 12 illustrates an example of a subsystem with an internal power measurement circuit, according to some embodiments. The subsystem in this example may include a switching integrated circuit 1210 that is used to make connections between a power wire from the environmental system and a return wire from the environmental system. The switching IC 1210 may be connected to a power wire connector 1202 and a return wire connector 1204. The switching IC 1210 may include one or more switching elements 1208 that can be opened/closed to interrupt/create an electrical connection between the power wire connector 1202 and the return wire connector 1204. The one or more switching elements 1208 may include high-power field-effect transistors (FETs), relays, and/or other mechanical/electrical switches.

Because the relatively low-power smart-home device may interface with relatively high-power environmental systems, the one or more switching elements 1208 may be required to conduct very large voltage/current levels compared to the operating voltage/current levels of the smart-home device. For example, an HVAC system may provide a 24 VAC signal from the HVAC system that runs through the one or more switching elements 1208. When the one or more switching elements 1208 are closed to create an electrical connection, the current running through these elements 1208 may generate heat. An internal voltage measurement circuit 1214 may measure an electrical characteristic of the one or more switching elements 1208 that may be used to estimate an amount of power dissipated by the switching IC 1210. In this example, the voltage across the one or more switching elements 1208 may be measured in real time. In this example, the one or more switching elements 1208 are modeled as an ideal switch with a corresponding on-resistance 1207. The on-resistance 1207 of the one or more switching elements 1208 may be known, and the voltage and resistance value 1207 may be used to calculate a total amount of power dissipated by the switching IC 1210 as heat.

The voltage measurement circuit 1214 may provide a number of different types of outputs to the processor. For example, a raw voltage measurement may be provided, and the dissipated power may be calculated by the processor using the known value for the on-resistance 1207. In other embodiments, the switching IC 1210 may provide a current measurement through the one or more switching elements 1208 as part and an onboard telemetry system. Current, voltage, temperature, and any other electrical characteristic may be provided by the switching IC 1210 and provided as an input to a model, algorithm, or lookup table at the processor to predict an effect of the internal heating on the ambient temperature measurement made by the temperature sensor of the smart-home device.

In some embodiments, the switching IC 1210 may compensate for internal resistance as current increases. When current increases and the temperature in the device increases, the on-resistance of the one or more switching elements 1208 may change with the temperature. Therefore, some embodiments may include a circuit that compensates for the resistance as temperature rises such that as temperature increases, the current measurement may remain accurate as resistance changes. Although the switching IC 1210 of FIG. 12 returns a voltage measurement 1216, other embodiments may return different types of electrical measurements. As resistance is compensated, the switching IC 1210 may report back the internal resistance, or it may make the total power calculation onboard before reporting a total power back to the main processor.

This ability to measure current and/or heat that is dissipated through a subsystem may be particularly important when controlling environmental systems. For example, a thermostat may handle very high currents from the HVAC that are not generated by the power rail 612 itself. Instead, these high currents are provided by the external system and partially dissipated internally by the smart-home device. In some embodiments, very high currents, such as used in electric baseboard heaters may use small relays with very high contact resistance. Characterizing this resistance and using the measured voltage/current with this resistance may be key to characterizing components that may contribute heavily to internal heating effects.

Figure 13:
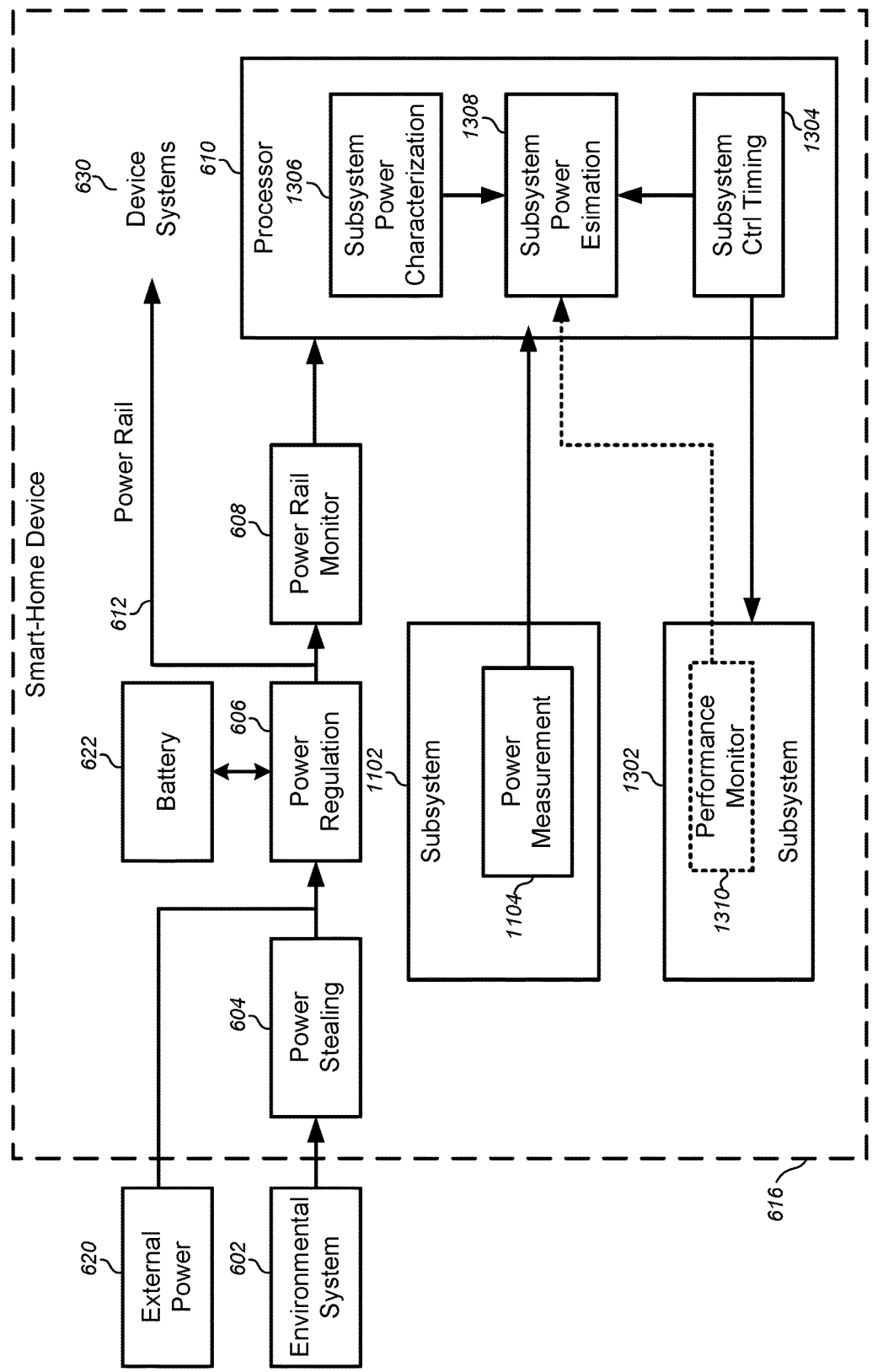
FIG. 13 illustrates a simplified block diagram of the smart-home device that is configured to estimate power dissipated by a subsystem using software controls of the processor.

FIG. 13 illustrates a simplified block diagram of the smart-home device 616 that is configured to estimate power dissipated by a subsystem 1302 using software controls of the processor 610. Instead of measuring power input or dissipated by the subsystem 1302 as described above, some embodiments may also estimate power that is turned into heat by the subsystem 1302 by virtue of a control scheme used by the processor 610 to activate or deactivate the subsystem 1302. The processor 610 may activate the subsystem 1302 by sending an enable signal or some other signal that may be interpreted by the subsystem 1302 to go from one power-usage level to another power-usage level. For example, the processor 610 may send an interrupt signal to a Wi-Fi chip and cause the Wi-Fi chip to send a message across a local wireless network. By virtue of these control signals, the processor 610 knows when the Wi-Fi chip is activated and when it is deactivated, either because the processor 610 sends both of these signals, or the processor 610 sends the activation signal and knows how long the Wi-Fi chip will be active to send the corresponding message.

Instead of receiving an electrical measurement/characteristic from the subsystem 1302 as described above for the subsystem 1102, the processor 610 may instead use a state of operation for the subsystem 1302 as well as a length of time that the subsystem 1302 operated in that state as an input to a model, lookup table, algorithm, or equation for determining an internal-heating effect. As described above, the subsystem 1302 may be electrically characterized in a testing or laboratory environment to determine how much heat is generated when operating in each state and/or for different amounts of time. When the subsystem 1302 is activated by the processor 610, the processor can use the amount of time that the subsystem 1302 is active, as well as the state of the subsystem 1302 as inputs to the model, lookup table, or equation. The model, etc., may be fitted such that these inputs predict an amount of internal heating that may be generated due to the operation of the subsystem 1302.

In this example, the subsystem 1302 does not need to report any electrical characteristic to the processor 610, nor does the processor 610 need to measure any electrical characteristics of the subsystem 1302. Instead, an input to a model, lookup table, etc., may be generated knowing programmatically when the subsystem 1302 is operating and how much power is converted into internal heat for each known operating state of the subsystem 1302. This may effectively reduce the amount of measurement circuitry required in the subsystem 1302 and/or on the circuit board that holds the subsystem 1302 and/or the processor 610. A control timing process 1304 may record times at which the subsystem 1302 is placed in certain states. The characterization 1306 of these states may be stored in a lookup table or database, or embodied in a model or equation. The characterization 1306 may then be used to estimate power dissipated into heat by the subsystem 1302 by a power-estimation process 1308. These processes 1306, 1308 may be separate discrete processes, or alternatively may be embodied in a model that is trained to output an effective internal heat generation as described below.

In some embodiments, the subsystem 1302 need not be directed to operate by the processor 610. Instead, the subsystem 1302 may be commanded or caused to operate by external events or systems. The subsystem 1302 may optionally include a performance monitor 1310 that records when the subsystem 1302 was operative. The log from the performance monitor 1310 may be reported to the processor 610, and the processor 610 may use this information as described above to estimate an effect on the temperature measurement. For example, a Wi-Fi radio may be pinged by a local network. In this case, the Wi-Fi radio need not necessarily wake the processor 610 to report its use. Instead, the Wi-Fi radio may discard keep-alive messages, provide acknowledgment messages, and otherwise operate somewhat autonomously. Because the processor 610 does not necessarily need to cause the Wi-Fi radio to operate, the log kept at the processor 610 may be incomplete. Therefore, the processor 610 may query a record of events or operational states from the Wi-Fi radio and use that information as an input to determine the effect of the Wi-Fi operations on the internal temperature measurement. In another example, an LED backlight boost may include a setting that determines a brightness level for the LED. Because the processor knows the brightness level at which the backlight boost is set, this information may be combined with a table relating corresponding power usage with the brightness levels to determine power usage by the LED.

Each of these methods discussed above for estimating power that is converted into heat may be used in any combination and without limitation. In practice, smart-home devices may include dozens of different subsystems. Some embodiments may monitor a main power rail 612 while simultaneously monitoring a plurality of subsystems 1102 that provide internal power measurement circuits 1104, as well as monitoring a plurality of subsystems 1302 that have their internal heat generation estimated by the processor itself 610. In short, each of these different methods may provide different types of inputs that may all be used as inputs to a model that is trained to output an effect on a temperature measurement. The power rail monitor 608 may provide a total power dissipated by the smart-home device 616, while the individual subsystem measurements/estimates may characterize how heat is dissipated and distributed inside the smart-home device 616. Thus, some embodiments may use a hybrid approach, using each of these types of inputs for predicting an effect on a temperature measurement. While placing a current monitor on every subsystem or component is an option in some embodiments, others may rely at least in part on knowing when components have operated and how to translate that use schedule into an effect on the temperature measurement.

The combination of a power rail monitor 608 with various power measurement circuits 1104, performance monitors 1310 and/or subsystem software controls in the subsystem timing process 1304 can provide an accurate measurement of both the power received by the smart-home device 616, as well as how that power consumption is distributed throughout the smart-home device 616. For example, the power rail monitor 608 and a power measurement circuit 1104 on a switching circuit for an environmental system such as an HVAC system may measure the total power used by the smart-home device 616. The power measurement circuits 1104 on the other subsystems in the smart-home device 616, combined with the software controls to know when subsystems are operating, may be used to determine where and how the total power is dissipated throughout the device. In summary, the system illustrated in FIG. 13 not only has the ability to measure power from a primary power supply/battery that is used to power the internal electronics of the smart-home device 616, but it also has the ability to measure the effect of heat dissipated from power that runs through the device from external environmental systems. This ability is advantageous for controllers or thermostats that dissipate a large amount of energy from the systems that they control (e.g., floor heaters, electric baseboard heaters, large-current systems, etc.). Additionally, some embodiments may use this hybrid approach to record precisely when, where, and how power is dissipated in the device. This information may be used to build a thermal model of the device (e.g. the model described below in FIG. 14) that accurately models how heat from each subsystem affects the temperature sensor.

In some embodiments, the smart-home device 616 may receive an input that identifies an external environmental system that is coupled to the smart-home device 616. Instead of measuring power received/dissipated from the external environmental system, the smart-home device may use the identifying information for the external environmental system as an input to a lookup table and/or model for predicting its effect on a temperature measurement. For example, a make/model of an HVAC system may be provided to the processor of the smart-home device 616. This information may be used to look up a power efficiency, power usage, and/or other power characteristic of the HVAC system. In some cases, different HVAC systems may be characterized to populate a lookup table of temperature effects and/or to train a model that generates a known temperature affect. This allows the smart-home device 616 to at least in part rely programmatically on software controls and known characteristics of controlled systems instead of relying exclusively on direct power measurements.

Instead of using reactive, empirical methods for measuring heat generated by the subsystems, some embodiments may instead use these power measurements to predict an effect on an ambient temperature measurement. For example, some embodiments may include lookup tables that characterize the effect of each subsystem on the ambient temperature measurement. These tables may be generated as each of the subsystems are characterized in a controlled environment as described above. An input to the lookup table may include a subsystem state, a subsystem power usage, and/or other operating characteristics of a subsystem. The output of the lookup table may include a corresponding effect on the ambient temperature measurement. For example, a subsystem using 100 mA of current from a 3.3 V power rail for 5 seconds may increase the measured temperature by 0.1 deg. In another example, the main processor may instruct a wireless communication chip to send a message on a local Wi-Fi network, or may receive an indication that the wireless communication chip has received a message on the local Wi-Fi network. A lookup table may receive an indication of the type of operation took place and/or how long the wireless communication chip was active to output an effect on the ambient temperature measurement. Each of the effects of the different operating subsystems may be extracted from the lookup tables in real time to adjust a temperature measurement to more accurately predict the true ambient temperature.

Figure 14:
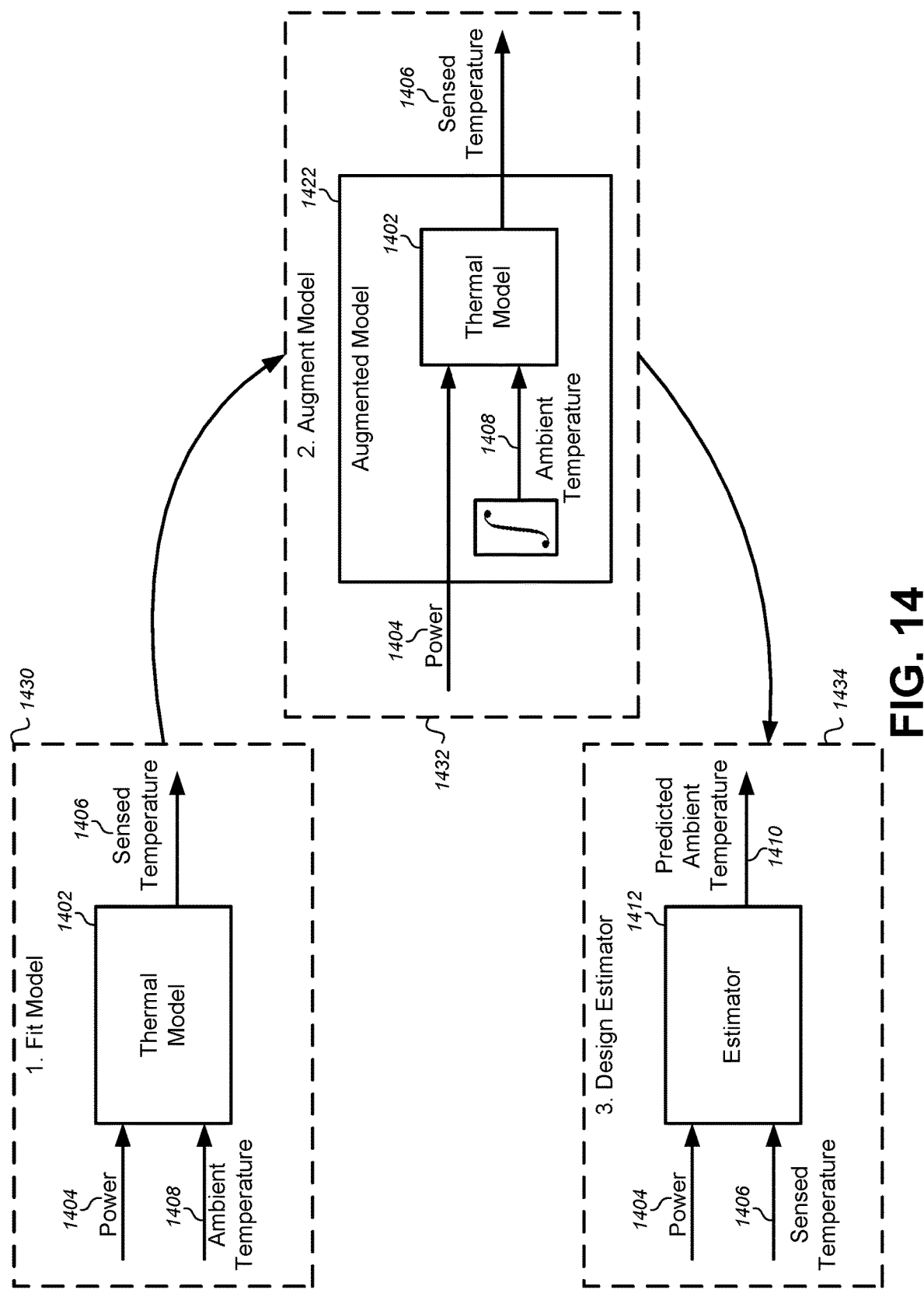
FIG. 14 illustrates an example of how a model may be built and trained to be used in an estimator for predicting ambient temperature, according to some embodiments.

FIG. 14 illustrates an example of how a model may be built and trained to be used in an estimator for predicting ambient temperature, according to some embodiments. A first step (1430) in the process may include fitting a model using power inputs. A thermal model 1402 may be generated that approximates a thermal model of the smart-home device. In some embodiments, the thermal model 1402 may be based on first principles. For example, the thermal model 1402 may include thermal masses and thermal resistances between the thermal volumes of the smart-home device. The thermal model 1402 may receive various power inputs 1404 as well as an ambient temperature input 1408, and may generate a sensed temperature 1406 output.

In some embodiments, the thermal model 1402 may group together inputs that have a similar effect on the temperature measurement. For example, inputs that have a similar time constant or gain as to their effect on the temperature measurement may be grouped together in the thermal model 1402. Other inputs that may affect the temperature measurement differently may be considered separately by the thermal model 1402.

The thermal model 1402 may be trained in a laboratory or simulation environment where all of the inputs and outputs are known quantities. The ambient temperature 1408 may be measured in the air surrounding the smart-home device in the laboratory environment. The sensed temperature 1406 may be generated by the thermal model 1402 in response to the ambient temperature 1408 and the power inputs 1404. The coefficients and other parameters of the thermal model 1402 may be fitted as the model 1402 is trained based on the experimental or simulated data. Training the model 1402 may include fitting the model by assigning coefficients to each input that scale or modify the values based on their respective effects on the sensed temperature measurement. The model 1402 may also include internal layers or other coefficients that may be assigned as part of the training process.

The power inputs 1404 may be any of the inputs described above in this disclosure. For example, the power inputs 1404 may include power or current measurements from the power line monitor described above. The power inputs 1404 may also include electrical measurements from current monitors that correspond to individual subsystems in the smart-home device. In some embodiments, the power inputs 1404 may include indications from software that a subsystem has been activated or transitioned into a particular state. Some embodiments receive attributes of the operating state of a subsystem. For example, systems on a chip (SoCs) and microprocessors may use dynamic frequency scaling (DFS) and/or dynamic voltage and frequency scaling (DVFS) to throttle the operating voltage and/or clock frequency depending on the processing load. The settings or operating point for the DFS or the DVFS for each of the subsystems may also be provided as power inputs 1404. Any other system states/settings that may affect the internal heating characteristics of the smart-home device may be provided to the thermal model 1402 as inputs in addition to the power inputs 1404. For example, the processor itself may estimate its own power usage as an input to the model by considering the software load, the clock speed, and other operational factors of the processor. Some processors or subsystems may also include onboard temperature sensors, and these measured temperatures may be provided as inputs to the model.

Some embodiments may incrementally include different subsets of all of the different possible inputs described above. For example, some embodiments may use only the current/power measurement from the main power rail monitor described above. Some embodiments may use the measurements from the main power rail monitor along with a measurement from a switching relay integrated circuit. Some embodiments may use these two inputs along with various software control schedules indicating when a processor has instructed other subsystems to be active. Some embodiments may then add power measurements from individual power monitors. Some embodiments may allow the selection of inputs to be configurable during runtime. For example, the smart-home device may receive an update that changes the thermal model and/or power inputs 1404 that are used for estimating temperature while the smart-home device is operating.

In a second step 1432, the thermal model 1402 may be used to build an augmented model. The augmented model may be used to build the estimator described below. During normal operation, the ambient temperature 1408 is an unknown variable. Some embodiments may only use a single temperature sensor in the smart-home device, and that temperature sensor may be affected by the internal heating generated by the power-consuming components of the smart-home device as described above. Therefore, the actual sensed temperature 1406 may be the value that is measured by the smart-home device and used as an input to an estimator to estimate the actual ambient temperature 1408. In some embodiments, the thermal model 1402 may be a state space model. Since the ambient temperature 1408 is an unknown variable, the ambient temperature input 1408 may be replaced by adding an additional state to the state space of the thermal model 1402. For example, this state may be generated using an integrator with no inputs, and in the simplest case may represent a constant with an unknown value. The thermal model 1402 may have the augmented model 1422 wrapped around it to include the integrator for the ambient temperature 1408. The power inputs 1404 and/or other system settings/states may still be provided as inputs to the augmented model 1422, and the sense temperature 1406 may still be provided as an output.

In a third step 1434, the augmented model 1422 may be provided to an estimator 1412. The estimator 1412 may be designed using the principles of a Kalman filter. A Kalman filter is an algorithm that uses a series of measurements observed over time by the temperature sensor that include noise and inaccuracies caused by the internal heating, and produces an estimate of an unknown variable representing the predicted ambient temperature 1410. The estimator 1404 may receive the power inputs 1404 described above of the same type as that were provided to the thermal model 1402 during training. The estimator 1412 may also receive the sensed temperature 1406 from the internal temperature sensor of the smart-home device. As the sensed temperature 1406 readings are received, the estimator 1412 may use a Kalman estimation correction loop to quickly correct the measured sensed temperature 1406 and generate a predicted ambient temperature 1410 that accurately compensates for any internal heating.

This method may generate a predicted ambient temperature 1410 that is fully responsive to all of the different power consumption metrics that may be measured or recorded on the smart-home device. This method does not require more than a single temperature sensor on the smart-home device and saves cost and space by eliminating the need for additional internal/external temperature sensors that would otherwise be required to estimate the ambient temperature from temperature measurements alone.

Figure 15:
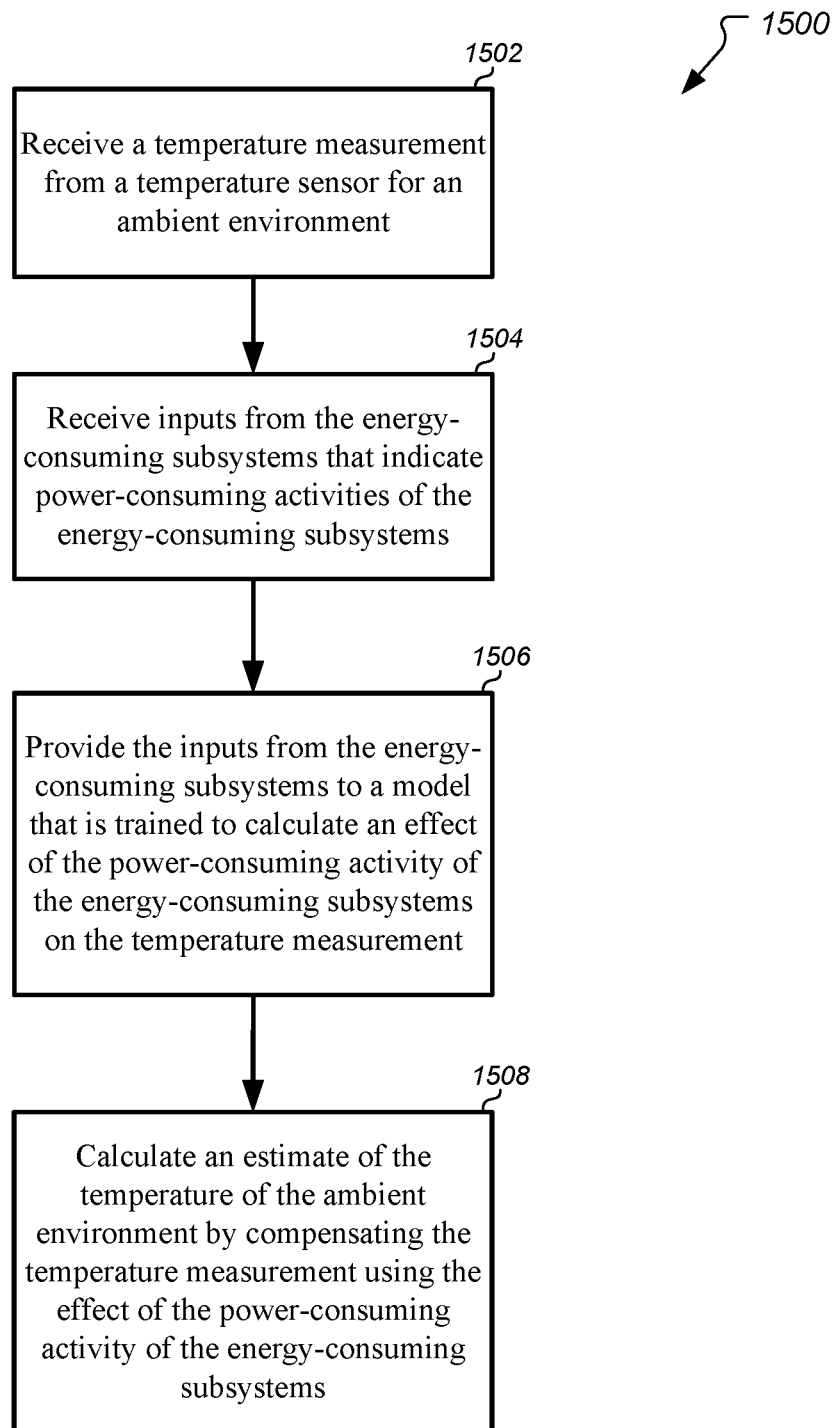
FIG. 15 illustrates a flowchart of a method for estimating ambient temperatures to compensate for internal heating, according to some embodiments.

FIG. 15 illustrates a flowchart of a method for estimating ambient temperatures to compensate for internal heating, according to some embodiments. The method may include receiving a temperature measurement from a temperature sensor for an ambient environment surrounding the temperature sensor (1502). The temperature sensor may be part of a smartphone device, such as a thermostat or a digital home assistant, such as the Nest Learning Thermostat® or the Google Home®. The device may include a housing that encloses the temperature sensor and/or one or more energy-consuming subsystems in the housing. The raw temperature measurement from the temperature sensor may be artificially high due to internal heating caused by power-consuming activities of the one or more energy consuming sub systems.

The method may also include receiving one or more inputs from the one or more energy-consuming subsystems that indicate power-consuming activities of the energy-consuming subsystems (1504). The energy-consuming subsystems may include a main power rail, a main power rail monitor, a solid-state switching circuit that switches a power supply from an external environmental system such as a triggering circuit for HVAC system, an LED, a user interface, a screen, a processor, a wireless communication component, and/or any other smart-home device subsystem. The inputs that indicate the power-consuming activities of the one or more energy consuming subsystems may include information from integrated power monitors or logs from the subsystems themselves, a schedule or record of control outputs provided by the processor to the subsystems, a sleep/idle cycle record of the processor itself, power measurements from power monitors that are placed in line with the components, measurements from onboard telemetry systems, and/or any other information that may be indicative of when, how, and/or how much energy was used by the various subsystems.

The method may further include providing the inputs from the plurality of energy-consuming subsystems to a model that is trained to calculate an effect of the power-consuming activity of the energy-consuming subsystems on the temperature measurement from the temperature sensor (1506). The model may be trained and/or executed as described above in FIG. 14. For example, the method may include generating an estimator that receives the inputs from the energy-consuming subsystems along with a temperature measurement from the temperature sensor. The estimator may be generated by first training a thermal model of the smart-home device and then augmenting the thermal model with an integrator that acts as an ambient temperature input for the thermal model.

The method may additionally include calculating an estimate of the temperature of the ambient environment by compensating the temperature measurement from the temperature sensor using the effect of the power-consuming activity of the energy-consuming subsystems (1508). This compensated temperature may be used by the smart-home device to control an external environmental system such as an HVAC system, to provide information to a user, to calculate time-to-temperature estimates, and/or perform any other temperature-related tasks.

It should be appreciated that the specific steps illustrated in FIG. 15 provide particular methods of compensating for internal heat generation in a temperature measurement according to various embodiments. Other sequences of steps may also be performed according to alternative embodiments. For example, alternative embodiments may perform the steps outlined above in a different order. Moreover, the individual steps illustrated in FIG. 15 may include multiple sub-steps that may be performed in various sequences as appropriate to the individual step. Furthermore, additional steps may be added or removed depending on the particular applications. Many variations, modifications, and alternatives also fall within the scope of this disclosure.

The Smart-Home Environment

Figure 16:
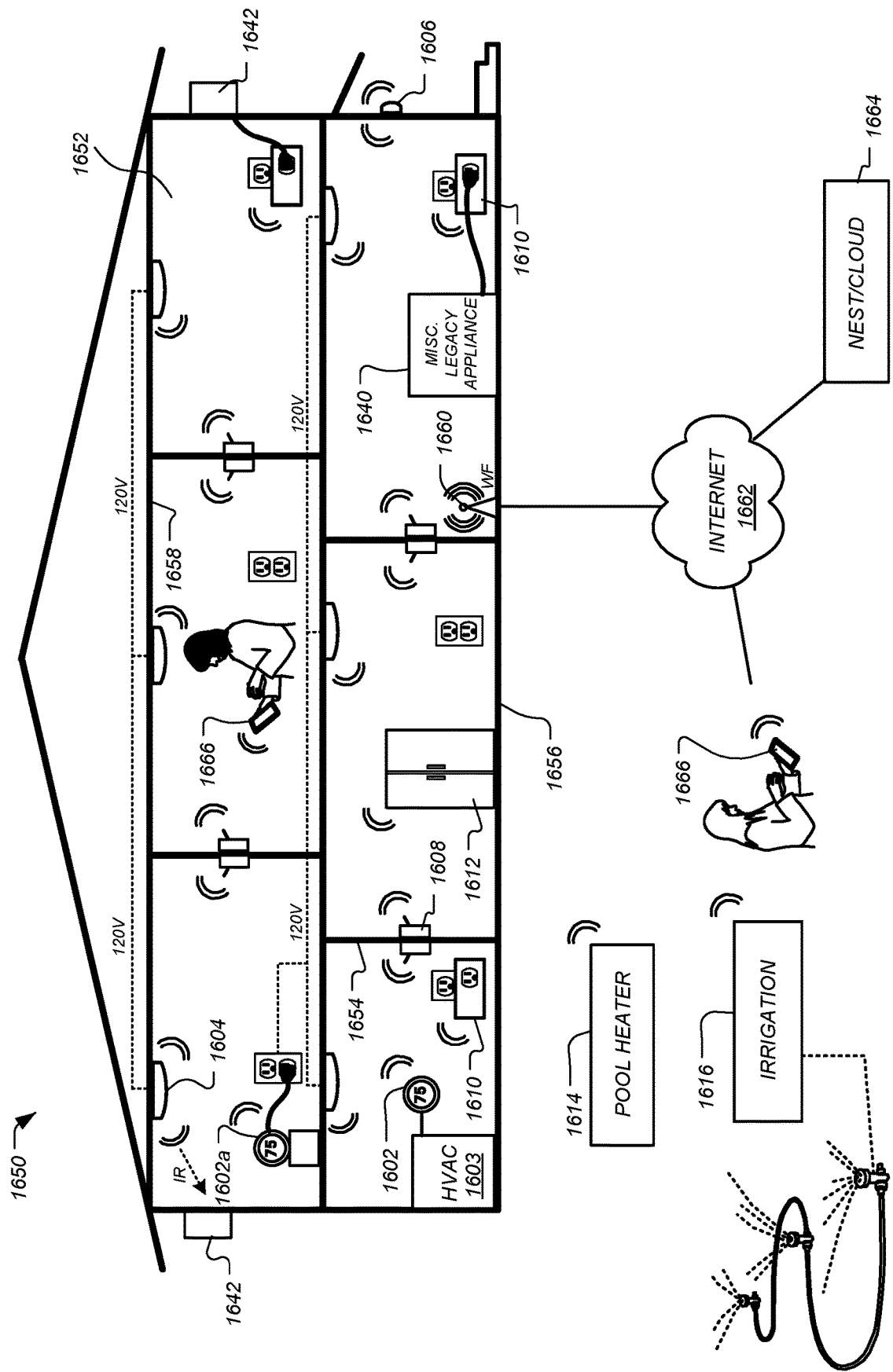
FIG. 16 illustrates an example of a smart home environment within which one or more of the devices, methods, systems, services, and/or computer program products described further herein can be applicable.

FIG. 16 illustrates an example of a smart home environment within which one or more of the devices, methods, systems, services, and/or computer program products described further herein can be applicable. The depicted smart home environment includes a structure 1650, which can include, e.g., a house, office building, garage, or mobile home. It will be appreciated that devices can also be integrated into a smart home environment that does not include an entire structure 1650, such as an apartment, condominium, or office space. Further, the smart home environment can control and/or be coupled to devices outside of the actual structure 1650. Indeed, several devices in the smart home environment need not physically be within the structure 1650 at all. For example, a device controlling a pool heater or irrigation system can be located outside of the structure 1650.

The depicted structure 1650 includes a plurality of rooms 1652, separated at least partly from each other via walls 1654. The walls 1654 can include interior walls or exterior walls. Each room can further include a floor 1656 and a ceiling 1658. Devices can be mounted on, integrated with and/or supported by a wall 1654, floor or ceiling.

The smart home depicted in FIG. 16 includes a plurality of devices, including intelligent, multi-sensing, network-connected devices that can integrate seamlessly with each other and/or with cloud-based server systems to provide any of a variety of useful smart home objectives. One, more or each of the devices illustrated in the smart home environment and/or in the figure can include one or more sensors, a user interface, a power supply, a communications component, a modularity unit and intelligent software as described herein. Examples of devices are shown in FIG. 16.

An intelligent, multi-sensing, network-connected thermostat 1602 can detect ambient climate characteristics (e.g., temperature and/or humidity) and control a heating, ventilation and air-conditioning (HVAC) system 1603. One or more intelligent, network-connected, multi-sensing hazard detection units 1604 can detect the presence of a hazardous substance and/or a hazardous condition in the home environment (e.g., smoke, fire, or carbon monoxide). One or more intelligent, multi-sensing, network-connected entryway interface devices 1606, which can be termed a "smart doorbell", can detect a person's approach to or departure from a location, control audible functionality, announce a person's approach or departure via audio or visual means, or control settings on a security system (e.g., to activate or deactivate the security system).

Each of a plurality of intelligent, multi-sensing, network-connected wall light switches 1608 can detect ambient lighting conditions, detect room-occupancy states and control a power and/or dim state of one or more lights. In some instances, light switches 1608 can further or alternatively control a power state or speed of a fan, such as a ceiling fan. Each of a plurality of intelligent, multi-sensing, network-connected wall plug interfaces 1610 can detect occupancy of a room or enclosure and control supply of power to one or more wall plugs (e.g., such that power is not supplied to the plug if nobody is at home). The smart home may further include a plurality of intelligent, multi-sensing, network-connected appliances 1612, such as refrigerators, stoves and/or ovens, televisions, washers, dryers, lights (inside and/or outside the structure 1650), stereos, intercom systems, garage-door openers, floor fans, ceiling fans, whole-house fans, wall air conditioners, pool heaters 1614, irrigation systems 1616, security systems (including security system components such as cameras, motion detectors and window/door sensors), and so forth. While descriptions of FIG. 16 can identify specific sensors and functionalities associated with specific devices, it will be appreciated that any of a variety of sensors and functionalities (such as those described throughout the specification) can be integrated into the device.

In addition to containing processing and sensing capabilities, each of the devices 1602, 1604, 1606, 1608, 1610, 1612, 1614 and 1616 can be capable of data communications and information sharing with any other of the devices 1602, 1604, 1606, 1608, 1610, 1612, 1614 and 1616, as well as to any cloud server or any other device that is network-connected anywhere in the world. The devices can send and receive communications via any of a variety of custom or standard wireless protocols (Wi-Fi, ZigBee, 6LoWPAN, Thread, Bluetooth, BLE, HomeKit Accessory Protocol (HAP), Weave, etc.) and/or any of a variety of custom or standard wired protocols (CAT6 Ethernet, HomePlug, etc.). Each of the devices 1602, 1604, 1606, 1608, 1610, 1612, 1614 and 1616 may also be capable of receiving voice commands or other voice-based inputs from a user, such as the Google Home® interface. The wall plug interfaces 1610 can serve as wireless or wired repeaters, and/or can function as bridges between (i) devices plugged into AC outlets and communicating using Homeplug or other power line protocol, and (ii) devices that not plugged into AC outlets.

For example, a first device can communicate with a second device via a wireless router 1660. A device can further communicate with remote devices via a connection to a network, such as the Internet 1662. Through the Internet 1662, the device can communicate with a central server or a cloud-computing system 1664. The central server or cloud-computing system 1664 can be associated with a manufacturer, support entity or service provider associated with the device. For one embodiment, a user may be able to contact customer support using a device itself rather than needing to use other communication means such as a telephone or Internet-connected computer. Further, software updates can be automatically sent from the central server or cloud-computing system 1664 to devices (e.g., when available, when purchased, or at routine intervals).

By virtue of network connectivity, one or more of the smart-home devices of FIG. 16 can further allow a user to interact with the device even if the user is not proximate to the device. For example, a user can communicate with a device using a computer (e.g., a desktop computer, laptop computer, or tablet) or other portable electronic device (e.g., a smartphone). A webpage or app can be configured to receive communications from the user and control the device based on the communications and/or to present information about the device's operation to the user. For example, the user can view a current setpoint temperature for a device and adjust it using a computer. The user can be in the structure during this remote communication or outside the structure.

The smart home also can include a variety of non-communicating legacy appliances 1640, such as old conventional washer/dryers, refrigerators, and the like which can be controlled, albeit coarsely (ON/OFF), by virtue of the wall plug interfaces 1610. The smart home can further include a variety of partially communicating legacy appliances 1642, such as IR-controlled wall air conditioners or other IR-controlled devices, which can be controlled by IR signals provided by the hazard detection units 1604 or the light switches 1608.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A smart-home device comprising:
   a main power rail that provides power to one or more components of the smart-home device;
   an integrator coupled to the main power rail that stores energy on an energy-storage device, wherein the energy stored on the energy-storage device is representative of an amount of power provided to the smart-home device through the main power rail during an integration cycle of the integrator, and wherein:
   each integration cycle of the integrator begins when the energy stored on the energy-storage device is reset; and
   each integration cycle of the integrator ends when an electrical measurement of the energy-storage device meets or exceeds a threshold; and
   a counter that stores a number of integration cycles performed by the integrator during a time interval, wherein a total amount of power provided to the smart-home device through the main power rail during the time interval is represented by:
   a product of a number of integration cycles performed by the integrator during the time interval and a known total amount of energy provided to the main power rail during a single integration cycle divided by a length of the time interval; and
   the energy stored on the energy-storage device.

2. The smart-home device of claim 1, wherein:
   the integrator comprises an operational amplifier configured to operate as an integrator; and
   the energy-storage device comprises a capacitor coupled to an output of the operational amplifier.

3. The smart-home device of claim 1, further comprising a transistor between the energy-storage device and a ground, wherein a reset signal causes the transistor to drain the energy stored on the energy-storage device to the ground.

4. The smart-home device of claim 1, further comprising:
   a resistor on the main power rail; and
   a differential amplifier that generates an output based on an instantaneous voltage drop across the resistor on the main power rail, wherein the output of the differential amplifier is sent to the integrator.

5. The smart-home device of claim 4, wherein the output of the differential amplifier is sent through a low-pass filter before being sent to the integrator.

6. The smart-home device of claim 1, further comprising:
   a comparator that compares an electrical measurement of the energy-storage device to a threshold.

7. The smart-home device of claim 1, further comprising:
   an analog-to-digital converter that converts an electrical measurement of the energy-storage device.

8. The smart-home device of claim 1, wherein the counter is part of a microprocessor integrated circuit, and the integrator is a board-level component.

9. A method of measuring an amount of power provided to a smart-home device through a main power rail, the method comprising:
   providing power to one or more components of the smart-home device through a main power rail;
   storing energy on an energy-storage device using an integrator that is coupled to the main power rail, wherein the energy stored on the energy-storage device is representative of an amount of power provided to the smart-home device through the main power rail during an integration cycle of the integrator, and wherein:
  each integration cycle of the integrator begins when the energy stored on the energy-storage device is reset; and
  each integration cycle of the integrator ends when an electrical measurement of the energy-storage device meets or exceeds a threshold;
counting a number of integration cycles performed by the integrator during a time interval; and
calculating a total amount of power provided to the smart-home device through the main power rail during the time interval using:
  a product of a number of integration cycles performed by the integrator during the time interval and a known total amount of energy provided to the main power rail during a single integration cycle divided by a length of the time interval; and
  the energy stored on the energy-storage device.

10. The method of claim 9, wherein:
each integration cycle of the integrator begins when a reset signal causes the energy stored on the energy-storage device to be removed from the energy-storage device.

11. The method of claim 9, further comprising calculating the total amount of power provided to the smart-home device through the main power rail during the time interval at least in part by:
  converting the energy stored on the energy-storage device into a digital representation; and
  determining an amount of power used during a current integration cycle based on the digital representation.

12. The method of claim 9, wherein the smart-home device comprises a thermostat.

13. The method of claim 9, wherein the smart-home device comprises a digital home assistant.

14. The method of claim 9, further comprising providing the total amount of power provided to the smart-home device through the main power rail during the time interval to a thermal model for estimating an ambient temperature around the smart-home device.

15. A power-measurement circuit comprising:
an integrator coupled to a main power rail, wherein the integrator stores energy on an energy-storage device, and the energy stored on the energy-storage device is representative of an amount of power provided through the main power rail during an integration cycle of the integrator, and wherein:
  each integration cycle of the integrator begins when the energy stored on the energy-storage device is reset; and
  each integration cycle of the integrator ends when an electrical measurement of the energy-storage device meets or exceeds a threshold; and
a counter that stores a number of integration cycles performed by the integrator during a time interval, wherein a total amount of power provided through the main power rail during the time interval is represented by:
  a product of a number of integration cycles performed by the integrator during the time interval and a known total amount of energy provided to the main power rail during a single integration cycle divided by a length of the time interval; and
  the energy stored on the energy-storage device.

16. The power-measurement circuit of claim 15, wherein:
the integrator comprises an operational amplifier configured to operate as an integrator; and
the energy-storage device comprises a capacitor coupled to an output of the operational amplifier.

17. The power-measurement circuit of claim 15, further comprising a transistor between the energy-storage device and a ground, wherein a reset signal causes the transistor to drain the energy stored on the energy-storage device to the ground.

18. The power-measurement circuit of claim 15, further comprising:
a resistor on the main power rail; and
a differential amplifier that generates an output based on an instantaneous voltage drop across the resistor on the main power rail, wherein the output of the differential amplifier is sent to the integrator.

19. The power-measurement circuit of claim 18, wherein the output of the differential amplifier is sent through a low-pass filter before being sent to the integrator.

* * * * *